(12) United States Patent
Kawahara et al.

(10) Patent No.: US 7,222,244 B2
(45) Date of Patent: May 22, 2007

(54) SEMICONDUCTOR DEVICE INCLUDING A PREDICTION CIRCUIT TO CONTROL A POWER STATUS CONTROL CIRCUIT WHICH CONTROLS THE POWER STATUS OF A FUNCTION CIRCUIT

(75) Inventors: Takayuki Kawahara, Higashiyamato (JP); Takehiro Shimizu, Kokubunji (JP); Fumio Arakawa, Kodaira (JP); Hiroyuki Mizuno, Kokubunji (JP); Takao Watanabe, Fuchu (JP); Koichiro Ishibashi, Warabi (JP)

(73) Assignee: Hitachi, Ltd., Tokyo (JP)

( * ) Notice: Subject to any disclaimer, the term of this patent is extended or adjusted under 35 U.S.C. 154(b) by 426 days.

(21) Appl. No.: 09/932,099

(22) Filed: Aug. 20, 2001

(65) Prior Publication Data
US 2002/0101257 A1 Aug. 1, 2002

(30) Foreign Application Priority Data
Jan. 30, 2001 (JP) ............................. 2001-021109

(51) Int. Cl.
*G06F 1/32* (2006.01)
(52) U.S. Cl. ...................... 713/300; 713/320; 713/600
(58) Field of Classification Search ................ 713/300, 713/320, 600
See application file for complete search history.

(56) References Cited

U.S. PATENT DOCUMENTS

| | | | | |
|---|---|---|---|---|
| 4,334,308 A | * | 6/1982 | Thinschmidt et al. | .......... 714/46 |
| 4,891,743 A | * | 1/1990 | May et al. | ...................... 363/87 |
| 5,063,355 A | * | 11/1991 | Sasaki et al. | ................ 327/392 |
| 5,585,750 A | | 12/1996 | Noguchi et al. | |
| 5,602,975 A | * | 2/1997 | Kataoka et al. | ............. 358/1.16 |
| 5,675,282 A | | 10/1997 | Saito | |
| 5,964,881 A | * | 10/1999 | Thor | ........................... 713/501 |
| 6,014,512 A | * | 1/2000 | Mohamed et al. | ............. 703/27 |
| 6,353,308 B1 | * | 3/2002 | Ranta-aho et al. | ........... 323/266 |
| 6,477,654 B1 | * | 11/2002 | Dean et al. | .................. 713/300 |
| 6,625,740 B1 | * | 9/2003 | Datar et al. | .................. 713/324 |
| 6,658,447 B2 | * | 12/2003 | Cota-Robles | ............... 718/103 |

(Continued)

FOREIGN PATENT DOCUMENTS
JP 334267 12/1995
(Continued)

OTHER PUBLICATIONS
Takayama Tsutomu, "Image Forming Device", Japanese Patent 408295065A, Nov. 12, 1996.*
(Continued)

*Primary Examiner*—Rehana Perveen
*Assistant Examiner*—Tse Chen
(74) *Attorney, Agent, or Firm*—Antonelli, Terry, Stout & Kraus, LLP.

(57) ABSTRACT

A semiconductor device having a functional circuit block with predictive power controller is provided so as to construct a system LSI manufactured in a practicable number of design steps, which is extensible and in which power is reduced. The functional circuit block includes a prediction circuit and a predictive power shutdown circuit having a power status control circuit. The prediction circuit controls a power status of the functional circuit block by using the power status control circuit, based on input information thereto. When no information is inputted for a predetermined a period of time, the power status control circuit shifts from a power status of the functional circuit block to a low-power status.

2 Claims, 18 Drawing Sheets

U.S. PATENT DOCUMENTS

| | | | |
|---|---|---|---|
| 6,731,146 B1 * | 5/2004 | Gallardo | 327/158 |
| 6,760,303 B1 * | 7/2004 | Brouwer | 370/229 |
| 6,765,389 B1 * | 7/2004 | Moore | 324/430 |
| 6,789,207 B1 | 9/2004 | Maejima | |

FOREIGN PATENT DOCUMENTS

| | | |
|---|---|---|
| JP | 54954 | 2/1996 |
| WO | WO 00/02118 | 1/2000 |

OTHER PUBLICATIONS

*IEEE Micro*, "Design Challenges of Technology Scaling", vol. 19, No. 4, pp. 23-29, 1999.

*IEEE SPECTRUM*, "Identifying Defects in Deep-Submicron CMOS ICS", pp. 66-71, Sep. 1996.

*Symposium on VLSI Circuits Digest of Technical Papers*, "Sub-threshold-Current Reduction Circuits for Multi-Gigabit DRAMS", pp. 45-46, May 1993.

*ISSCC Digest of Technical Papers*, "50% Active-Power Saving without Speed Degradation Using Standby Power Reduction (SPR) Circuit", pp. 318-319, 1995.

*Extended Abstract of the 1999 International Conference on Solid State Devices and Materials*, "Suppression of Stand-by Tunnel Current in Ultra-Thin Gate Oxide MOSFETS", pp. 264-265, 1999.

* cited by examiner chip chip

SEMICONDUCTOR DEVICE INCLUDING A PREDICTION CIRCUIT TO CONTROL A POWER STATUS CONTROL CIRCUIT WHICH CONTROLS THE POWER STATUS OF A FUNCTION CIRCUIT

BACKGROUND OF THE INVENTION

1. Field of the Invention

The present invention relates to a semiconductor device such as a system LSI (Large-Scaled Integration) for reducing power, and more particularly, to a semiconductor device, such as a system LSI, for controlling power so that the power is autonomously decentralized to be reduced, when mounting, on a chip, various IPs (Intellectual Properties) comprising circuit blocks or circuit modules, which have various functions for the system LSI in distributional formats.

2. Description of the Related Art

According to a technique as disclosed in a paper of "Design Challenges of Technology Scaling" in IEEE MICRO, Vol. 19, No. 4, pp. 23–29, 1999 (hereinafter, referred to as a first conventional art), power consumption of chips for microprocessors is greatly increased and many chips having power consumption of 100W or more have been sold after 2000. Further, according to the first conventional art, power consumption caused by a leak current is exponentially increased in accordance with the miniaturization for manufacturing. In particular, power consumption caused by a subthreshold leak current is remarkably increased.

Moreover, according to a technique as disclosed in a paper of "Identifying Defects in Deep-Submicron CMOS ICS" in IEEE SPECTRUM, pp. 66–71, on September, 1996 (hereinafter, referred to as a second conventional art), the miniaturization for manufacturing produces the increase in power consumption caused by a gate leak current and by a junction leak current such as GIDL (Gate-Induced Drain Leakage).

According to the first conventional art, in active power, when a signal amplitude matches a voltage supply, power $P_{AC}$ generated by charge/discharge of the load is proportional to a value of <(operating frequency f)×(load capacitance C)×(supply voltage V)×(supply voltage V)>. Therefore, conventionally, the supply voltage is reduced.

As disclosed in a record of "Subthreshold-Current Reduction Circuits for Multi-Gigabit DRAMS" titled at Symposium, on VLSI Circuits Digest of Technical Papers, pp. 45–46, on May, 1993, there is proposed a method using a power switch, in which a power switch is provided between a power supply line and a circuit, and power consumption $P_{SL}$ caused by the subthreshold leak current is reduced in a standby mode by turning off the power switch (hereinafter, referred to as a third conventional art).

In addition, as disclosed in "50% Active-Power Saving without Speed Degradation Using Standby Power Reduction (SPR) Circuit" titled in the ISSCC Digest of Technical Papers, pp. 318–319, 1995, there is proposed a substrate bias control method in which a subthreshold leak current is reduced in a standby mode by switching voltages of a substrate terminal in an MOS transistor forming a circuit, in an operating mode and a standby mode and also by a threshold voltage of the MOS transistor in the operating mode and the standby mode (hereinafter, referred to as a fourth conventional art).

In addition, as disclosed in "Suppression of Stand-by Tunnel Current in Ultra-Thin Gate Oxide MOSFETS by Dual Oxide Thickness MTCMOS (Dot-MTCMOS)" titled in "Extended Abstract of the 1999 International Conference on Solid State Devices and Materials, pp. 264–265, 1999, there is proposed a reducing method for power consumption $P_{GL}$ caused by a gate leak current during a standby mode in which a PMOS transistor having a thick oxide film is provided between a circuit comprising an MOS transistor having a thin oxide film and a power supply line, and a power switch is turned off in a standby mode of the circuit (hereinafter, referred to as a fifth conventional art).

In recent years, due to the increase in functions required for chips, the number of MOS transistors (hereinafter, referred to as MOSTs) integrated on the chip and an operating frequency are also increased. In accordance therewith, power $P_{AC}$ caused by charge/discharge of load power is further increased.

According to the first conventional art, the power $P_{AC}$ can be reduced. However, the first conventional art completely cannot correspond to the trend to increase the power $P_{AC}$. The power $P_{AC}$ can be generally reduced by decreasing the voltage. However, in this case, when a processing speed of the chip is maintained or improved, due to the necessity to set a threshold voltage of the MOST forming the chip to be low and the necessity to make a thickness of a gate oxide film of the MOST thin, the power consumption $P_{SL}$ caused by the subthreshold leak current and the power consumption $P_{GL}$ caused by the gate leak current are exponentially increased.

Although the first conventional art has the above problem, this art is most efficient to reduce the power consumption $P_{AC}$ caused by the charge/discharge of the load current and is widespread. However, as described in the first and second conventional arts, recently, power consumption $P_{SL}$ and $P_{GL}$ are increased for the above reason.

The third and fourth conventional arts propose a method for solving the increase in power consumption PSL and PGL. According to the third and fourth conventional arts, although the power consumption $P_{SL}$ and $P_{GL}$ can be low in a standby mode of the chip, the power consumption $P_{SL}$ and $P_{GL}$ cannot be low in an operating mode of the chip. Consequently, if the levels of the power consumption $P_{SL}$ and $P_{GL}$ caused by the subthreshold leak current and the gate leak current can be unconsidered, as compared with the level of the power $P_{AC}$ caused by the charge/discharge of the load, the consumption power $P_{SL}$ and $P_{GL}$ may be reduced only in the standby mode of the chip in which the level of the power $P_{AC}$ is close to zero. In this case, the third to fifth conventional arts are efficient. However, if the levels of the power consumption $P_{SL}$ and $P_{GL}$ caused by the subthreshold leak current and the gate leak current are substantially higher, as compared with the level of the power $P_{AC}$ caused by the charge/discharge of the load, the power consumption $P_{SL}$ and $P_{GL}$ have a serious effect on the power consumption of the chip in the operating mode and the power consumption cannot be reduced according to the third to fifth conventional art.

For the above reasons, in recent years, the power consumption of the chip, indicated by $(P_{AC}+P_{SL}+P_{GL})$ is greatly increased.

Further, in future, the system LSI will be designed by using various IPs according to a technique obtained by combining the above first to fifth conventional arts. In this case, preferably, the IPs can be designed without adding a designer. The development of the miniaturization for manufacturing causes the increase in the number of the IPs mounted on a chip having a predetermined area, for example, an (8×8 mm²)-sized chip and, consequently, the system is mounted on the single chip. In this case, the designer can hardly grasp and process the overall system LSI. Therefore, there is needed another system in which each module is operated to be autonomously decentralized and to correspond to the peripheral condition. Further, there is also needed a process for replacing only a specific part in the halfway of a designing process with other designing components, or a process for replacing only one circuit block having a specification different from those of other circuit blocks after designing.

SUMMARY OF THE INVENTION

It is an object of the present invention to provide a semiconductor device, such as a system LSI, in which power is autonomously decentralized for the reduction thereof when various on-chip IPs are provided. The above-mentioned problems are solved as follows.

According to the present invention, a prediction circuit and a power status control circuit are provided for an IP or a circuit block (hereinafter, abbreviated to a "circuit block"). In other words, a predictive power shutdown circuit, a predictive voltage changing circuit, or a frequency changing circuit is provided.

Accordingly, it is possible to autonomously decentralize and reduce power in the circuit block. A part of the circuit block can be easily exchanged. The overall circuit block or a part of the circuit clock can be controlled so that the power is reduced.

Further, by learning, a low-power status can be changed in accordance with the current state or an instruction from other component. Therefore, it is possible to construct a semiconductor device such as a system LSI manufactured in the practicable number of design steps, which is extensible with high performance and in which power is reduced.

Further objects, features and advantages of the present invention will become apparent from the following description of the preferred embodiments with reference to the attached drawings. In the attached drawings, the same reference number denotes the same or similar part.

DESCRIPTION OF THE PREFERRED EMBODIMENTS

Hereinbelow, a description is given of a semiconductor device according to preferred embodiments of the present invention.

<First Embodiment>

Figure 1:
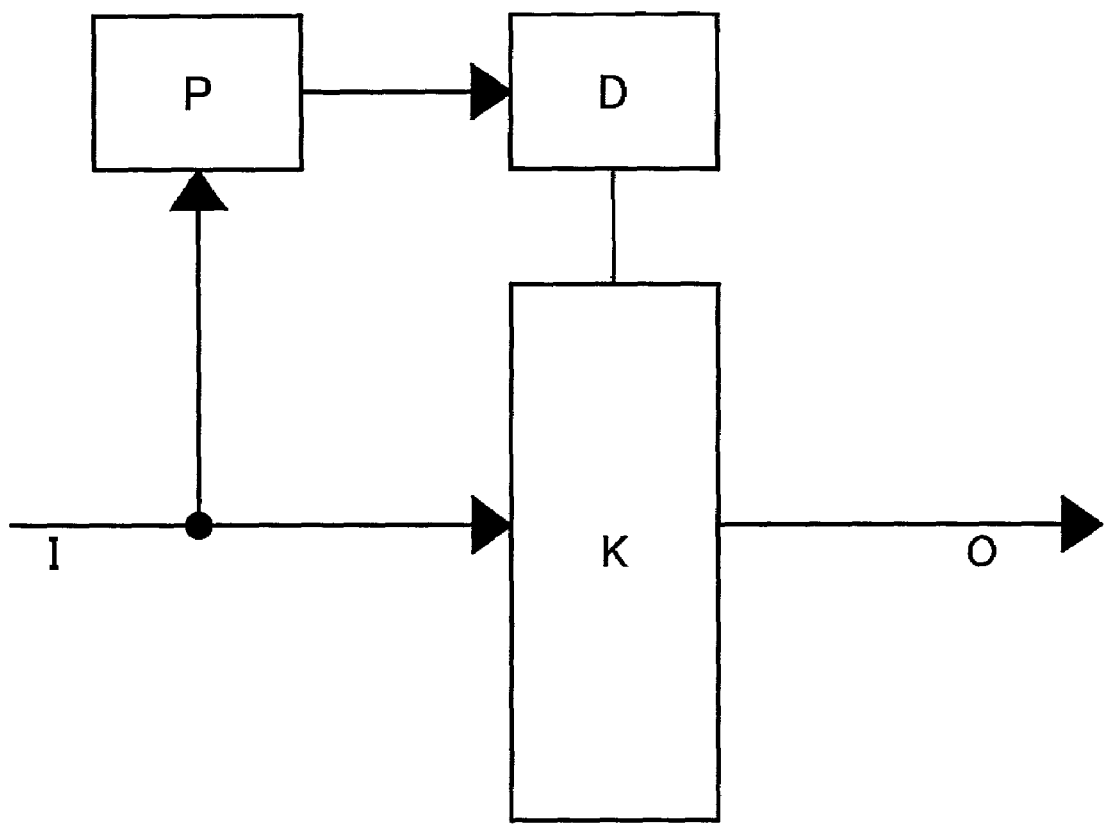
FIG. 1 is a block diagram showing the fundamental structure of a semiconductor device according to a first embodiment of the present invention.

Hereinbelow, a description is given of the structure of circuits in which one of a predictive power shutdown circuit, a predictive power voltage changing circuit, or a predictive frequency changing circuit is realized according to a first embodiment of the present invention with reference to FIG. 1. FIG. 1 shows a block diagram showing the fundamental structure of circuit in a semiconductor device according to the first embodiment in which a clock signal line, a control signal line, and the like, which are necessary according to respective examples of the structure of circuits, are omitted.

Referring to FIG. 1, reference symbol K denotes a functional circuit block, and reference symbol D denotes a power status control circuit which is provided between the functional circuit block K and a power supply VD, for controlling a power status of the functional circuit block K by changing a state thereof or a state of the functional circuit block K. A circuit block, as one unit, which is formed by providing a prediction circuit P and the power status control circuit D to the functional circuit block K, is referred to as a functional circuit block with predictive power controller in the embodiment described later.

The prediction circuit P controls the power status control circuit D. The prediction circuit P sets an input I to the functional circuit block K, as one input, and controls the power status control circuit D in accordance with a state of the input I.

In the above-mentioned structure, the prediction circuit P controls the power status control circuit D which controls a power status of the functional circuit block K based on information on the input I. For example, if there is no effective information on the input I for a predetermined time, the power status control circuit D shifts the power status of the functional circuit block K to a low-power status. Further, the power status control circuit D can perform this shift operation independently of any desired computation device. The power status control circuit D has the following functions, which will be described later.

(1) It is determined whether or not the functional circuit block K is connected to the power supply VD.

(2) The power supply which applies a voltage to the functional circuit block K is controlled.

(3) A frequency value of a clock supplied to the functional circuit block K is controlled.

(4) The functions (1) to (3) are combined.

<Second Embodiment>

Figure 2:
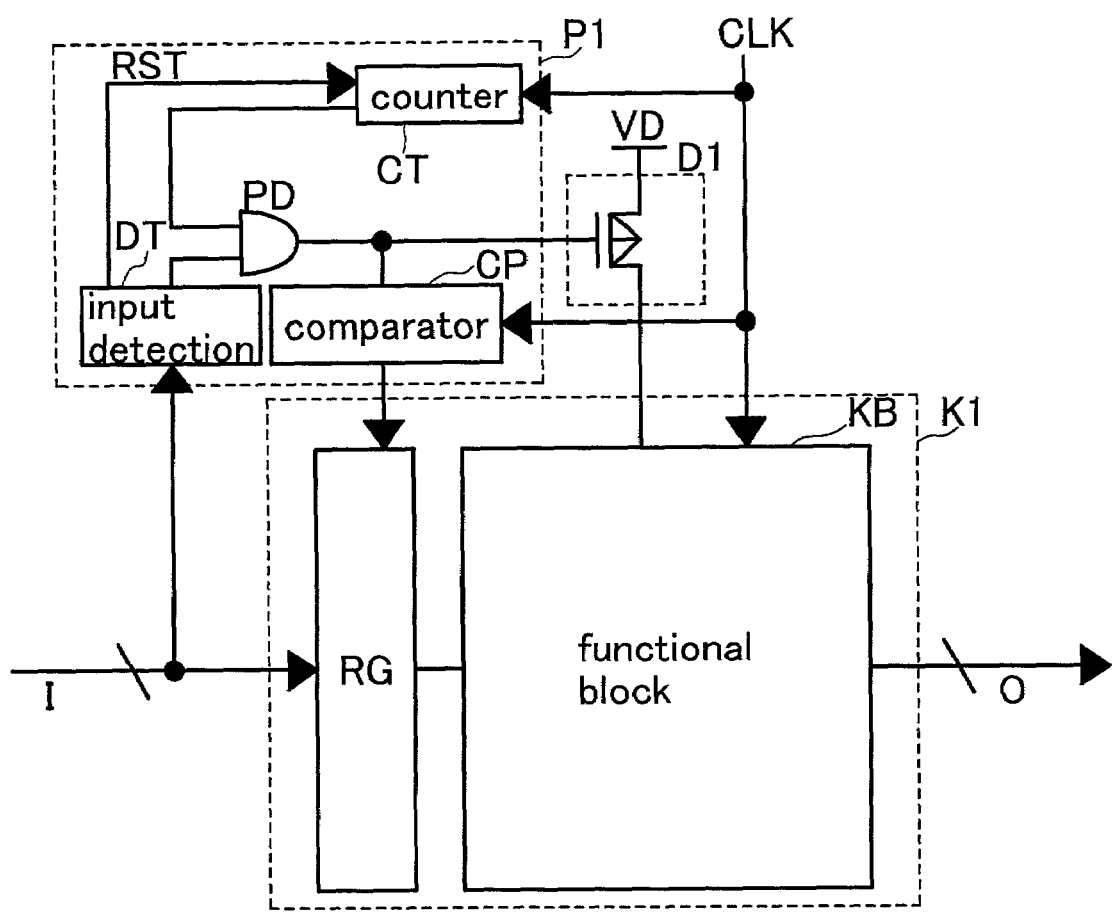
FIG. 2 is a block diagram showing the structure of circuits in a semiconductor device according to a second embodiment of the present invention.

Hereinbelow, a description is given of the structure in which a functional circuit block K1 is connected to a power supply VD by using a power status control circuit D1 controlled by a prediction circuit P1 according to a second embodiment of the present invention with reference to FIG. 2. Referring to FIG. 2, a clock CLK is inputted to the prediction circuit P1 and the functional circuit block K1. The functional circuit block K1 comprises a functional block KB for actual computation and a register RG connected to an input terminal I, for temporarily storing input information corresponding to m clocks. Incidentally, another register can be provided for an output terminal O.

The prediction circuit P1 comprises a counter CT for counting the number of clocks CLK, a controller PD for controlling the power status control circuit D1, an input detection DT for outputting a signal to the controller PD and outputting an RST signal for resetting the counter when a signal to the input I is detected and no signal is inputted, a comparator CP for controlling the register RG by comparing the output of the controller PD with the number of clocks CLK. The controller PD controls the power status control circuit D1 by performing AND operation for the outputs of the counter CT and the input detection DT. The counter CT counts the number of clocks CLK. The output of the input detection DT changes at n clocks CLK, and information on the change is transmitted to the controller PD. In parallel therewith, the comparator CP counts the number of clock CLK and controls the register RG in the functional circuit bock K1 in accordance with the output of the controller PD when m clocks CLK are counted.

The power status control circuit D1 for connecting the functional circuit block K1 to the power supply VD may be, for example, a p-channel MOST shown in FIG. 2. The p-channel MOST can be shut down by setting a voltage of a gate signal to be equal or higher than that of the power supply VD connected to a source, and it can be electrically connected by setting the voltage of the gate signal to be lower than that of the power supply VD applied to the source by a threshold voltage of the p-channel MOST or more.

In this case, a gate leak current which flows in the functional circuit block K1 can be suppressed by making a thickness of a gate oxide film of the p-channel MOST forming the power status control circuit D1, thicker than a gate oxide film of an MOST forming the functional circuit block K1, as mentioned in the fifth conventional art. Further, threshold voltages of both the MOSTs forming the power status control circuit D1 and the functional circuit block K1 may be similar. Or, an absolute value of the threshold value of the p-channel MOST in the power status control circuit D1 may be higher than that of the threshold value of the MOST in the functional circuit block K1. In this case, a subthreshold current can become lower. A difference of the threshold voltages in the functional circuit block K1 and the power status control circuit D1 can be produced by changing a length of the gate or by changing impurity concentration in a channel area. If the threshold voltages of the MOSTs in the functional circuit block K1 and the power status control circuit D1 are similar, a lower subthreshold current can be generated by making the gate voltage of the p-channel MOST in the power status control circuit D1 higher than the source voltage thereof.

Figure 18:
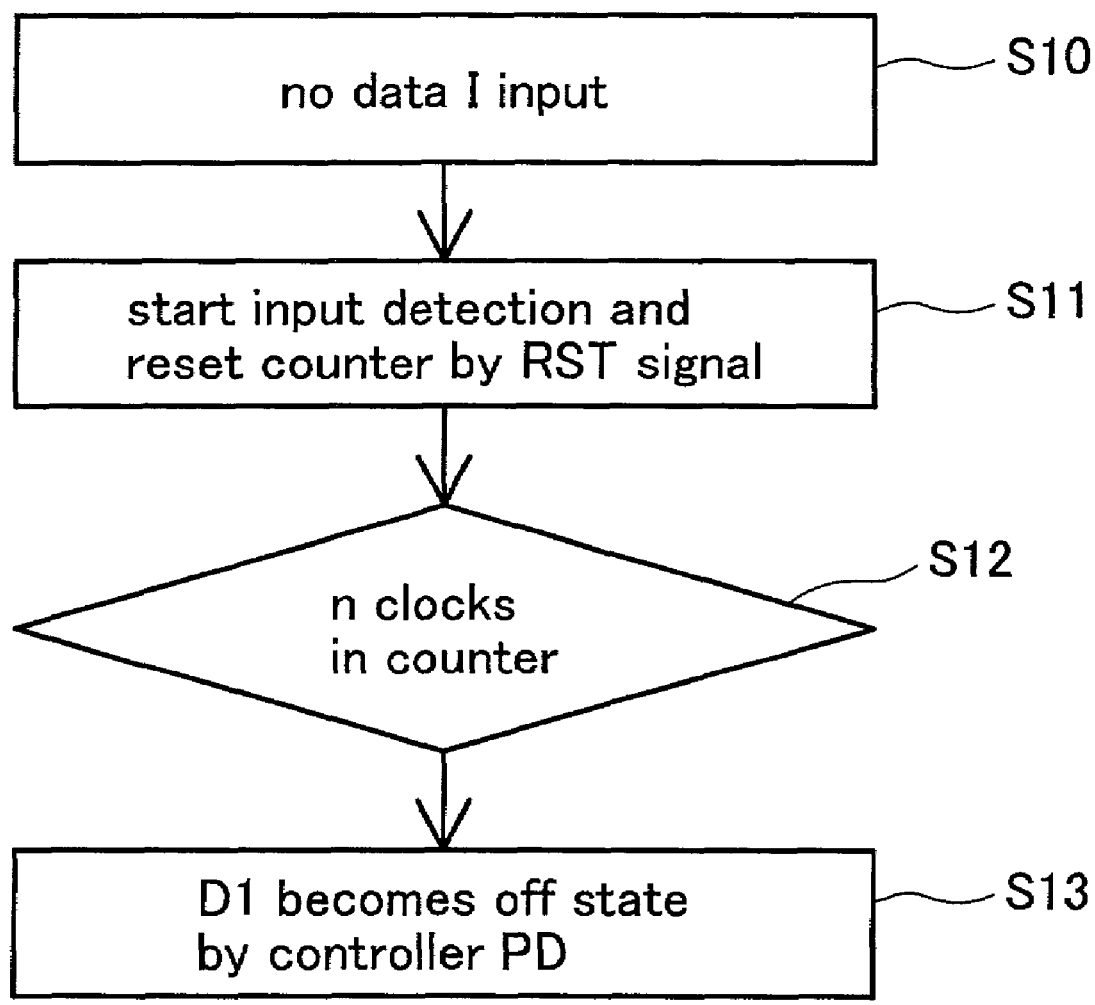
FIG. 18 is a flowchart of operations when no data is inputted and a high-power status shifts to a low-power status in the structure shown in FIG. 2.
Figure 19:
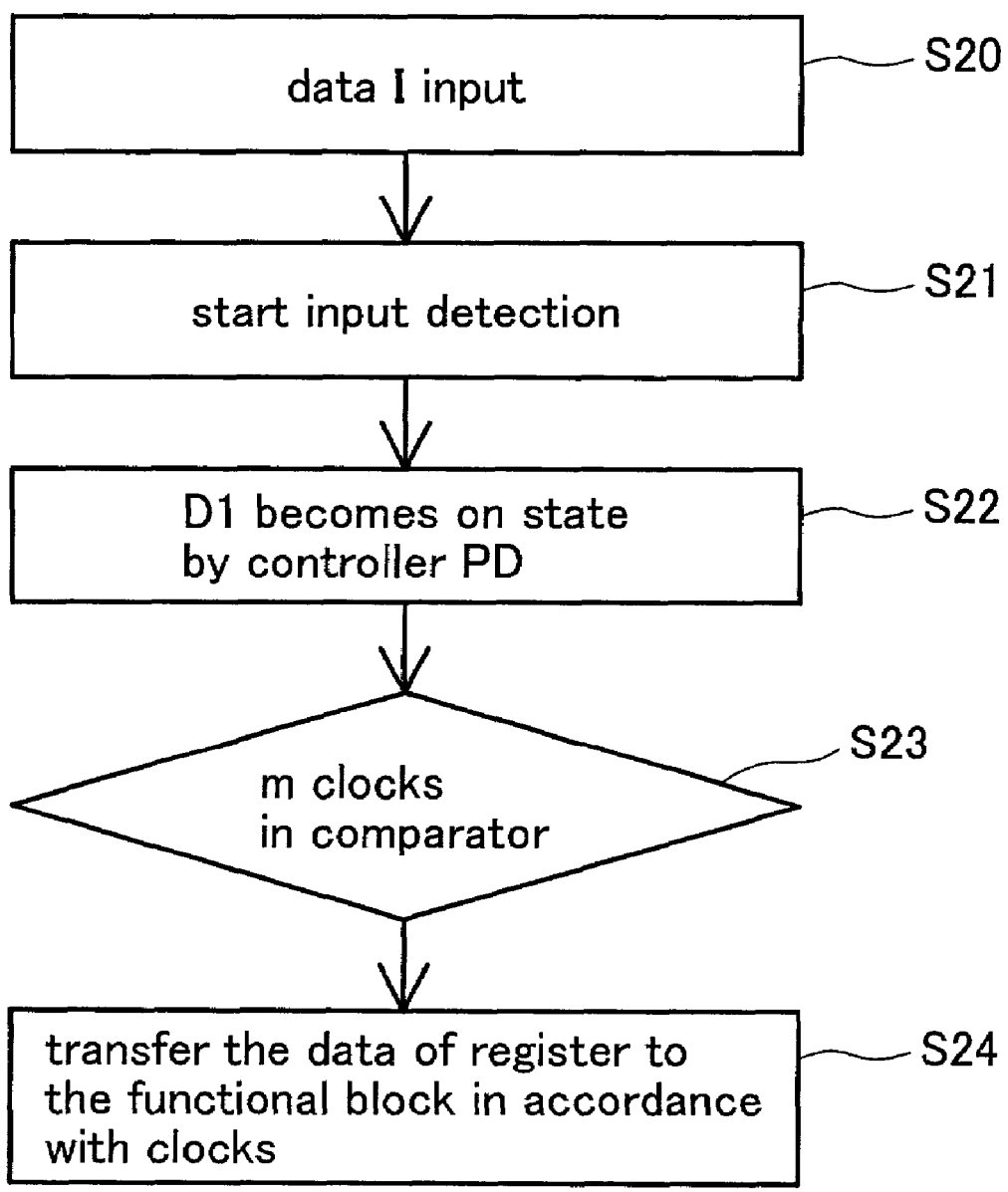
FIG. 19 is a flowchart of operations when data is inputted and the low-power status shifts to the high-power status in the structure shown in FIG. 2.

A description is given of examples of operations according to the second embodiment with reference to FIGS. 18 and 19.

FIG. 18 shows a flowchart of the example of the operations in a power status that changes from a high-power status in which data is inputted from the input I and thus the functional block KB is operated to a low-power status in which no data is inputted from the input I and the functional block KB is disconnected to the power supply VD.

First, no data is inputted to the input I (step S10).

Then, the input detection DT in the prediction circuit P1 starts to be operated, detects that no data is inputted to the input I, outputs a detected signal to the controller PD, and resets the counter CT by the RST signal (step S11).

The counter CT starts to count the number of clocks CLK at this timing and, when the number of clocks CLK is a predetermined number, i.e., n, it sends a signal indicating the above counting operation result to the controller PD (step S12).

In response to the two states in which the input detection DT detects no data to the input I and the counter CT determines that the number of clocks CLK is n, the controller PD shuts down the power status control circuit D1. In other words, the functional block KB is insulated from the power supply VD (step S13). Incidentally, the number n of clocks CLK corresponds to the number of clocks CLK for predicting how long no data is inputted. A method for setting an interval at which no data is inputted will be described later with reference to FIGS. 20A and 20B.

On the contrary, FIG. 19 shows a flowchart of the example of the operations in a power status that changes from the low-power status, in which the functional block KB is disconnected to the power supply VD, to the high-power status in which data is inputted from the input I and the functional block KB is operated.

First, data is inputted to the input I (step S20).

Then, the input detection DT is operated, detects that the data is inputted to the input I, outputs a detected signal to the controller PD (step S21).

In response to the output, the controller PD allows the power status control circuit D1 to be connected to the power supply VD, that is, the power status control circuit D1 is in an on-state. Consequently, the functional block KB shifts to an operating state (step S22).

In accordance with the change in output of the controller PD, the comparator CP starts to count the number of clocks CLK. When the number of clocks CLK reaches a predetermined number, i.e., m, the comparator CP sends a signal to the register RG in the functional circuit block K1 (step S23).

Data corresponding to the m clocks is stored in the register RG. In response to the signal from the comparator CP, the register RG starts to transfer the data to the functional block KB and the functional block KB performs desired computation (step S24). Incidentally, the number m of clocks CLK corresponds to the number of clocks CLK, necessary for a period of time from a timing at which the power status control circuit D1 is in the on-state to a timing at which the functional block KB is operated, and it is, e.g., 1.

As mentioned above, the power can be autonomously decentralized and can be set to be low or high when necessary, without using a control signal, by controlling the connection between the functional block KB and the power supply VD in accordance with the data to the input I. In the case of a general application, in other words, in the case in which data is not always inputted, the power becomes low.

Figure 20A:
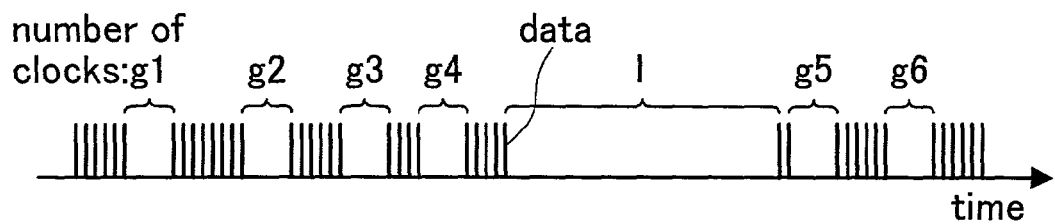
FIGS. 20A and 20B are diagrams showing examples of sequential data.

Hereinbelow, a description is given of the method for setting the number n of clocks CLK with reference to FIGS. 20A and 20B. The number n of clocks CLK corresponds to the number of clocks CLK at an interval thereof, in which no data is inputted and the power status control circuit D1 is continuously in the on-state. Although the data is transmitted synchronously with the clock CLK, it is not always transmitted at an interval corresponding to a predetermined number of clocks CLK and, generally, it is intermittently transmitted, irrespective of the number of the clocks CLK. In many cases, the size of the data and an interval between the ends of the data are specific.

Consider the interval at which no data is inputted. In this case, it is assumed that the data having the larger number of clocks CLK is extracted at the interval between the data ends during the instruction or the operation. FIG. 20A shows one example of sequential data. Referring to FIG. 20A, reference symbols g1, g2, g3, g4, g5, and g6 denote the numbers of clocks CLK at the intervals between the data ends. It is assumed the average of the numbers of clocks CLK is g and the variance of the numbers of clocks CLK is M and, then, the interval at which no data is inputted corresponds to approximately g clocks, i.e., (g±M) clocks CLK. For example, when g is 10, the interval corresponds to approximately 10 clocks CLK, i.e., (10±2) clocks CLK. Although the interval at which no data is inputted corresponds to only several clocks, in this case, the distribution of the numbers of clocks CLK may be considered in an area having a large number of clocks CLK at the interval at which no data is inputted and corresponds to approximately 10 clocks CLK in this case.

An area having approximately 10 clocks (for example, an area having 15 clocks or more) means that a new instruction is issued and no data is inputted at an interval, for example, corresponding to 200 clocks. In this case, the number n of clocks CLK described in FIGS. 2 and 18, can be 10 or 12.

As a result, if no data is inputted, the functional block KB is in the stand by mode at the interval corresponding to 10 or 12 clocks CLK. Therefore, when next data is inputted, the functional block KB enters the operating mode with high probability and the reduction of speed is suppressed. Since the operating mode of the power status control circuit D1 needs power, a fine control operation causes the increase in power. Therefore, if next data is inputted with high probability while the approximately 10 clocks CLK, preferably, the power status control circuit D1 is kept be in the on-state. On the other hand, if next data is not inputted after approximately 10 clocks CLK, no data is inputted with high probability while the 200 clocks CLK. In this case, the counter CT which counts the number of clocks CLK transmits the output indicating the number of clocks CLK reaches the predetermined value n, to the controller PD and the power status control circuit D1 is shut down, that is, it enters the off-state. Consequently, at the interval corresponding to the 200 clocks CLK, not only no active current flows but also the leak current is cut off.

Figure 20B:
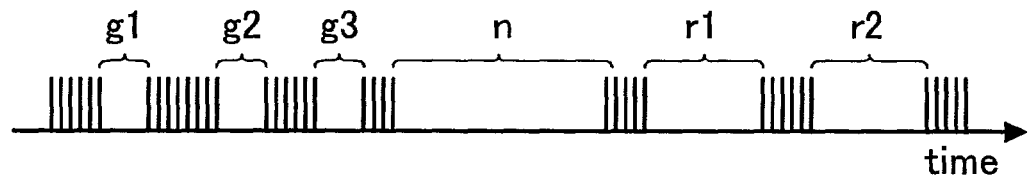

FIG. 20B shows another example of the sequential data. Referring to FIG. 20B, the intervals at which no data is inputted are intervals of an instruction or a computation corresponding to approximately g clocks CLK, e.g., g1, g2, and g3 and also are intervals of the instruction or the computation corresponding to approximately r clocks CLK, e.g., r1 and r2 where r denotes the average. Although a different case will be described later, in this case, the circuits in the prediction circuit P1 in FIG. 2 count the approximately r clocks CLK and a learning function for changing a cycle number of clocks CLK for extracting the signal of the counter CT to be k may be provided. There are various methods for setting the learning function and, for example, information corresponding to ten past intervals at which no data is inputted is stored, the average is computed, the computed average may compared with the predetermined average g and the number k of clocks CLK to determine whether it is close to g or k, and the learning function may thus be set. Although the predetermined cycle number of clocks CLK for extracting the signal of the counter CT have two values of g and r, it may have two values or more.

According to the second embodiment, since the input data is transferred to the functional block KB in the functional circuit block K1 via the register RG, a signal line for transmitting a data transferring trigger signal to the register RG in the functional circuit block K1 from the prediction circuit P1 is provided between the comparator CP and the register RG. However, if a speed before the operating mode of the functional block KB is substantially lower than the operating speed determined depending on a frequency of the clock CLK and the register RG can be omitted, obviously, the second embodiment also has the fundamental structure shown in FIG. 1.

<Third Embodiment>

Hereinbelow, a description is given of the structure in which power is reduced by controlling a voltage according to a third embodiment of the present invention with reference to FIG. 3.

Figure 3:
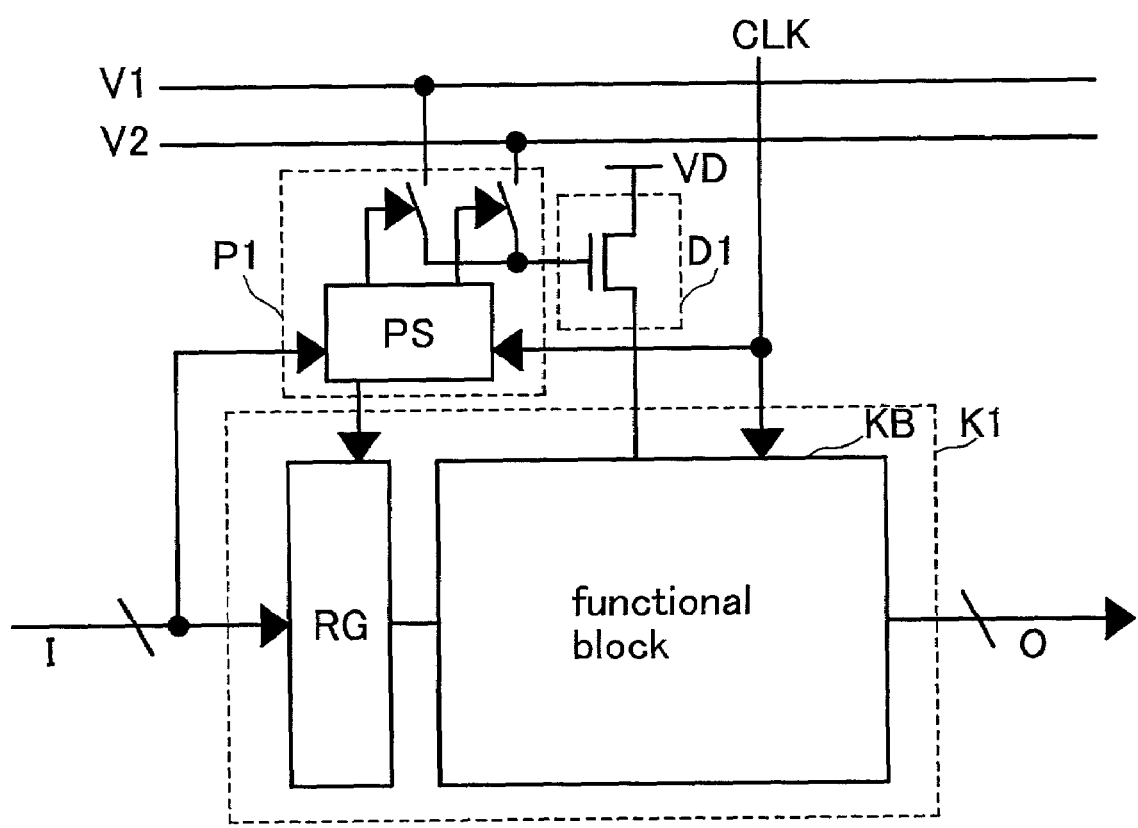
FIG. 3 is a block diagram showing the structure of circuits in a semiconductor device according to a third embodiment of the present invention.

Referring to FIG. 3, reference symbols V1 and V2 denote voltage signal lines for applying voltages to a gate of an MOST in the power status control circuit D1. A switch (not shown) in the prediction circuit P1 selects one of the voltage signal lines V1 and V2. Based on a state of the input data to the input I and the number of clocks CLK, a switch control circuit PS determines which one of the voltage signal lines V1 and V2 is connected and when the connection is realized, thereby performing a control operation. If a voltage applied by the voltage signal line V1 is higher than a voltage applied by the voltage signal line V2, the switch in the switch control circuit PS selects the voltage signal line V1 so that the voltage is applied to the gate of the MOST in the power status control circuit D1 when the data is inputted. If the MOST in the power status control circuit D1 is an n-channel MOST, a voltage lower than the voltage applied by the voltage signal line V1 by a threshold voltage is applied to the functional block KB in the functional circuit block K1.

On the contrary, when no data is inputted, after counting the predetermined number n of clocks CLK, the voltage signal line V2 applies a voltage to the gate of the n-channel MOST in the power status control circuit D1. A voltage lower than the voltage applied by the voltage signal line V2 by a threshold voltage is applied to the functional block KB. Since the voltage applied by the voltage signal line V2 is lower than the voltage applied by the voltage signal line V1, the voltage applied to the functional block KB is lower than the voltage which is applied, by the voltage signal line V1, to the gate of the n-channel MOST in the power status control circuit D1. As described in the first to fifth conventional arts, the power $P_{AC}$ generated by the charge/discharge of the load is low in a low-voltage state. Therefore, the power is low when the voltage signal line V2 applies the voltage to the gate of the n-channel MOST in the power status control circuit D1. According to the third embodiment, the shift operation in that the voltage signal line V1 is switched to the voltage signal line V2 and the control operation thereof are performed by modifying the method according to the second embodiment. That is, the method according to the second embodiment is modified in such a manner that the selection of the voltage signal line V1 corresponds to the on-state power status control circuit D1 in FIG. 2 and the selection of the voltage signal line V2 corresponds to the off-state power status control circuit D1 in FIG. 2. Referring to FIG. 3, the thickness of the oxide film of the MOST in the power status control circuit D1 can be thicker than the thickness of the oxide film forming the functional circuit block K1, thereby reducing the leak current. According to the third embodiment, a method for setting the threshold voltages has the advantage similar to that in FIG. 2. In accordance with an operating mode, the voltage applied by the voltage signal line V1 or V2 and, alternatively, the voltages applied by the voltage signal lines V1 and V2 may be changed. Specifically speaking, for instance, in a normal operating mode, voltages of 1.2V and 0.9V are applied to the voltage signal lines V1 and V2, respectively, and in a low-power mode, voltages of 0.9V and 0.7V are applied to the voltage signal lines V1 and V2, respectively.

<Fourth Embodiment>

Hereinbelow, a description is given of the structure in which the power is reduced by controlling a frequency according to a fourth embodiment of the present invention with reference to FIG. 4. A frequency of the clock CLK, which is inputted to the functional circuit block K1, is controlled. Therefore, according to the fourth embodiment, the power status control circuit D1 comprises a frequency divider DV for varying a frequency dividing ratio. Another power supply is provided. Although the structure in FIG. 4 is obtained by modifying the fundamental structure shown in FIG. 1, function units for changing the power status in FIG. 4 are the same as those in FIG. 1.

Figure 4:
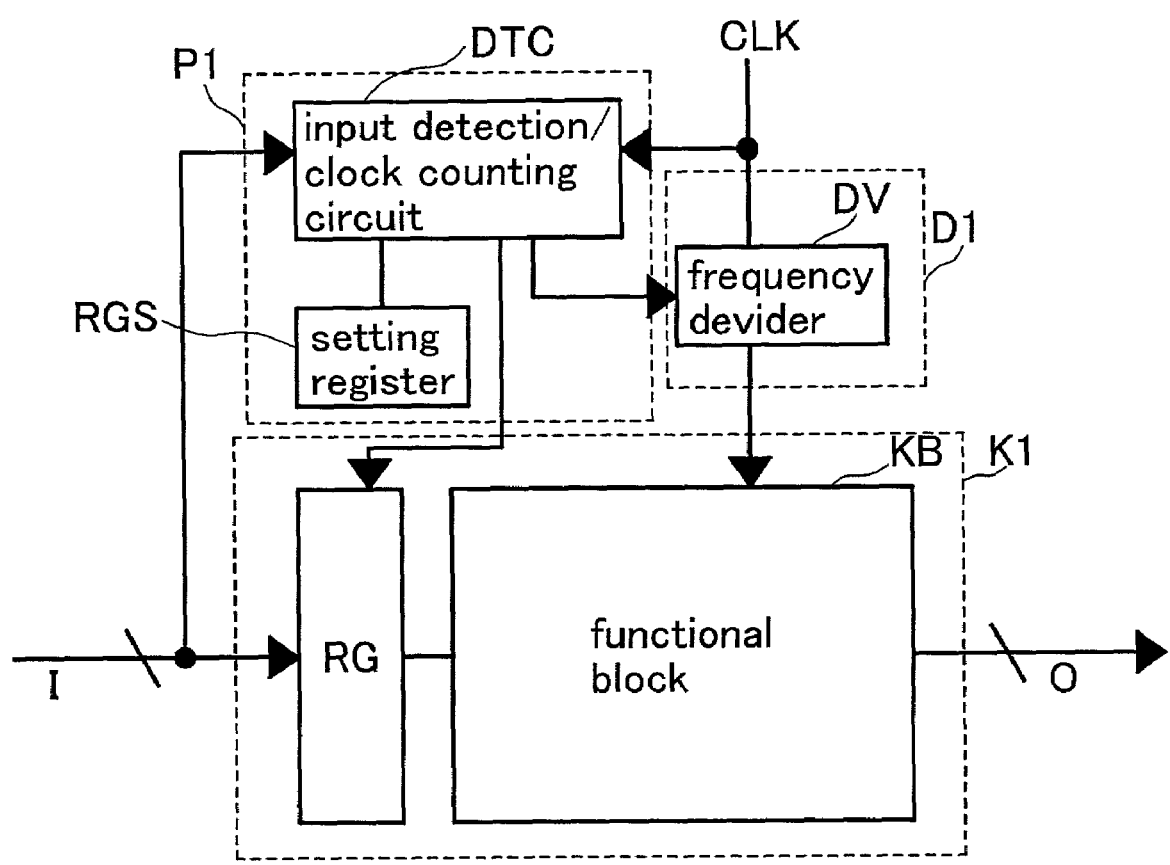
FIG. 4 is a block diagram showing the structure of circuits in a semiconductor device according to a fourth embodiment of the present invention.

Referring to FIG. 4, the on-state of the power status control circuit D1 in FIG. 2 corresponds to a case in which the clock CLK passes through the frequency divider DV having a low frequency dividing ratio and the resultant clock frequency is used by the functional circuit block K1, and the off-state of the power status control circuit D1 in FIG. 2 corresponds to a case in which the clock CLK passes through the frequency divider DV having a high frequency dividing ratio and the resultant clock frequency is used by the functional circuit block K1. The frequency clock used by the functional circuit block K1 in the former case is higher than that in the latter case. In the former case, the frequency of the clock CLK includes a frequency which is transmitted in a raw state. As described in the first and second conventional arts, the power $P_{AC}$ generated by the charge/discharge of the load is proportional to the clock frequency and, consequently, the power consumption is reduced in the latter case.

The prediction circuit P1 comprises an input detection/clock counting circuit DTC for detecting whether or not data is inputted to the input I and for controlling the frequency divider DV by counting the number of clocks CLK, and a setting register RGS for storing the set data of the number of clocks CLK as described in FIG. 2.

The clock frequency inputted to the functional circuit block K1 is switched and controlled by the frequency divider DV having high and low frequency dividing ratios in a manner similar to that described in FIG. 2. Although the input detection DT and the controller PD in FIG. 2 switches the shutdown MOST in the power status control circuit D1 based on the number of clocks CLK and the presence or absence of the data to the input I, the input detection/clock counting circuit DTC in FIG. 4 totally may switch the frequency dividing ratio of the frequency divider DV to be low/high based on the number of clocks CLK and the presence or absence of the data to the input I.

Referring to FIG. 4, the power supplied to the functional circuit block K1 may use a constant power, or the variable power which is described in FIG. 3. Alternatively, the shutdown switch may be provided between the functional circuit block K1 and the power supply VD as shown in FIG. 2. Consequently, the leak current can be reduced.

<Fifth Embodiment>

Figure 5:
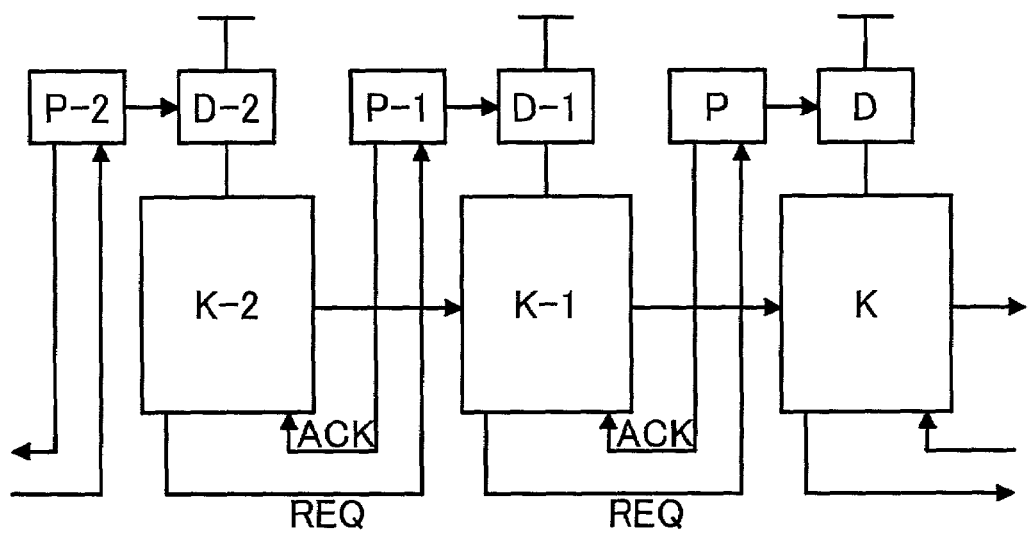
FIG. 5 is a block diagram showing the structure of circuits in a semiconductor device according to a fifth embodiment of the present invention.

Hereinbelow, a description is given of the case in which a semiconductor device comprises a plurality of the fundamental structures of the circuits, as blocks, shown in FIG. 1, according to a fifth embodiment of the present invention with reference to FIG. 5. Referring to FIG. 5, the former-stage circuit is initialized when a prediction circuit P is controlled. More specifically, in FIG. 5, a functional circuit block K-2 is started, and an REQ signal is outputted to a prediction circuit P-1, thus being in the standby mode for the initialization of a power status control circuit D-1. When the prediction circuit P-1 initializes the power status control circuit D-1 and the functional circuit block K-1 is operated, the prediction circuit P-1 returns an ACK signal to the functional circuit block K-2. The functional circuit block K-2 receives the ACK signal and, then, it transfers the data to the functional circuit block K-1. As mentioned above, the REQ signal and the ACK signal are received/transmitted between a set of the functional circuit block K-2, the prediction circuit P-2, and the power status control circuit D-2, and a set of the functional circuit block K-1, the prediction circuit P-1, and the power status control circuit D-1, thus receiving/transmitting the data.

Although the register RG is arranged on the input side in the functional circuit block K in FIGS. 2 to 4 or on the input side in each of the functional circuit blocks K, K-1, and K-2 in FIG. 5, it may be arranged on the output side in each of the functional circuit blocks K, K-1, and K-2 in FIG. 5.

As described above, in the operating mode, the power status control circuit D in FIG. 2, corresponding to the power status control circuits D-2, D-1, and D in FIG. 5, is in the on-state, a higher power voltage is applied to the functional circuit block K in FIG. 3, corresponding to the functional circuit blocks K-2, K-1, and K in FIG. 5, and a higher clock frequency is transmitted to the functional circuit block K in FIG. 4, corresponding to the functional circuit blocks K-2, K-1, and K in FIG. 5.

<Sixth Embodiment>

Figure 6:
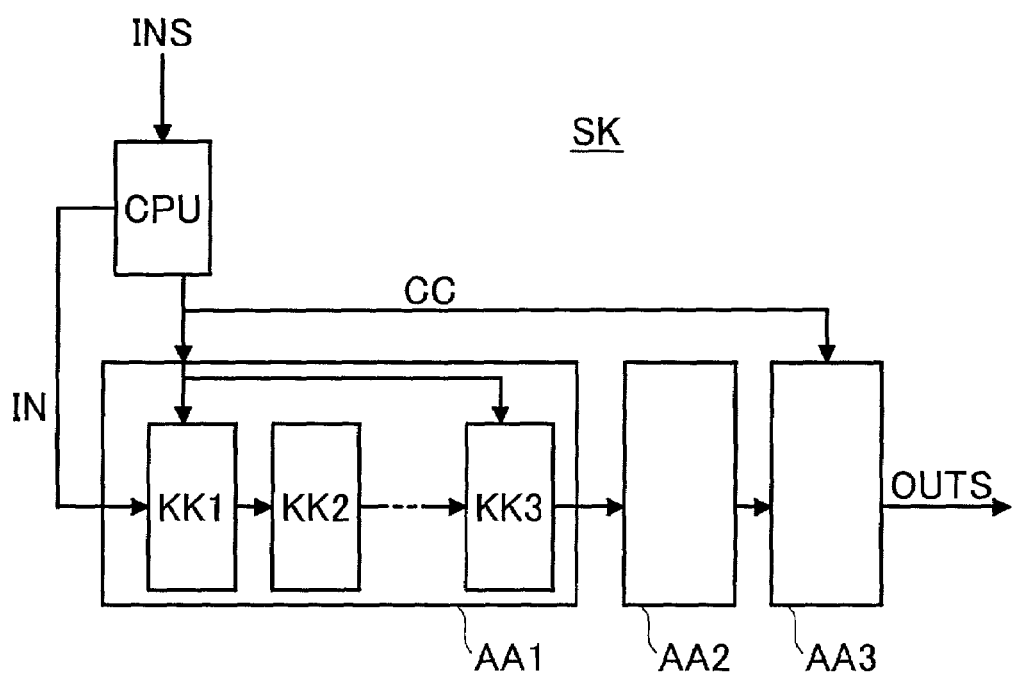
FIG. 6 is a block diagram showing the structure of circuits in a semiconductor device according to a sixth embodiment of the present invention.

Hereinbelow, a description is given of a case in which functional circuit blocks are provided according to a sixth embodiment of the present invention with reference to FIG. 6. Referring to FIG. 6, reference symbols KK1, KK2, . . . , KK3 denote functional circuit blocks with predictive power controller, corresponding to the fundamental circuits blocks K1, as unit blocks, shown in FIGS. 2 to 4. For example, the functional circuit block with predictive power controller KK1 comprises the prediction circuit P1, the power status control circuit D1, and the functional circuit block K1 which are shown in FIGS. 2 to 4. Similarly, the other functional circuit blocks with predictive power controller KK2 and KK3 comprise the prediction circuits P2 and P3, the power status control circuits D2 and D3, and the functional circuit blocks K2 and K3, respectively. Reference symbols AA1 and AA2 denote processing circuits comprising the functional circuit blocks with predictive power controller KK1 to KK3, which are controlled to be autonomously decentralized. Reference symbol AA3 denotes a processing circuit including no functional circuit blocks with predictive power controller KK1 to KK3, which is controlled by a control signal CC from a CPU.

A system SK denotes a system LSI comprising the processing circuits AA1 to AA3. In the system SK, input data IN is transmitted from the CPU, is inputted to the processing circuit AA1, and is transmitted via the processing circuits AA2 and AA3, thereby obtaining output data OUTS. Incidentally, the CPU may be mounted on a chip on which the system SK, as the system LSI, comprising processing circuits AA2 to AA3 is mounted or may be mounted on one chip different from another chip on which the system SK is mounted.

According to the sixth embodiment, the CPU totally controls the system SK. Data or an instruction INS is inputted to the CPU, and the CPU processes and transmits the data or the instruction INS inputted, thereby obtaining the input data IN. The control signal CC is transmitted by the CPU, it is inputted to the processing circuits AA1 and AA3, and, however, it is not inputted to the processing circuit AA2. The control signal CC may be inputted to all the functional circuit blocks with predictive power controller KK1 to KK3 in the processing circuit AA1 and, alternatively, as shown by the processing circuit AA1 in FIG. 6 it maybe be inputted to a part of the functional circuit blocks with predictive power controller KK1 to KK3, for example, only to the functional circuit blocks with predictive power controller KK1 and KK3. Or, the functional circuit blocks with predictive power controller KK1 to KK3 are segmented into a plurality of groups, and the control signal CC may be inputted, as a dedicated signal, to some of the segmented groups of the functional circuit blocks with predictive power controller KK1 to KK3.

According to the sixth embodiment, in the processing circuit AA1, the functional circuit blocks with predictive power controller KK1 to KK3 control an operation for autonomously decentralizing the power status in accordance with whether or not the data is inputted, as mentioned in FIGS. 2 to 4. Also, in the processing circuit AA2, the functional circuit blocks with predictive power controller KK1 to KK3 control an operation for autonomously decentralizing the power status in accordance with whether or not the data is inputted. Further, the CPU inputs the control signal CC to the functional circuit blocks with predictive power controller KK1 to KK3 in the processing circuit AA1, thereby controlling the power statuses of the functional circuit blocks with predictive power controller KK1 to KK3. That is, the operations described in FIGS. 2 to 4 are performed under the control of the CPU.

As one example of the control of the CPU, if the power status is controlled by changing the frequency as shown in FIG. 4, the CPU changes the frequency by monitoring the overall processing capacities of the functional circuit blocks with predictive power controller KK1 to KK3 and the processing circuits AA1 to AA3, so as to prevent the frequency from easily changing to be at the low level. In this case, the median of the number of clocks CLK may be determined by the CPU's detection of the overall processing capacity of the system SK or by an instruction transmitted from software.

As another example of the control of the CPU, if the power status is controlled by the power shutdown operation as shown in FIG. 2, the CPU controls the power status by monitoring the overall processing capacity of the system SK so as to prevent the power from being easily shut down. In this case, if setting the number of clocks CLK that is necessary until a timing at which the power is shut down after no data is inputted, a lower limit value thereof may be determined depending on the CPU's detection of the overall processing capacity of the system SK or depending on the instruction transmitted from software.

As another example of the control of the CPU, if the power status is controlled by switching the voltage as shown in FIG. 3, the CPU controls the voltage by monitoring the overall processing capacity of the system SK so as to prevent the voltage from being easily at the low level. In this case, if setting the number of clocks CLK that is necessary until a timing at which the voltage is changed to be at the low level after no data is inputted, a lower limit value thereof may be determined depending on the CPU's detection of the overall processing capacity of the system SK or depending on the instruction transmitted from software.

As a consequence, it is possible to prevent such a situation that the power is partially in a preferable status and, however, it is not totally in the preferable status. A designer designs only a component which is controlled by the CPU so as to reduce the power, thus reducing the power of a fine block constructing the component in the manner described in FIGS. 2 to 4. Therefore, the design efficiency can be improved while improving the reduction of the power.

<Seventh Embodiment>

Figure 7:
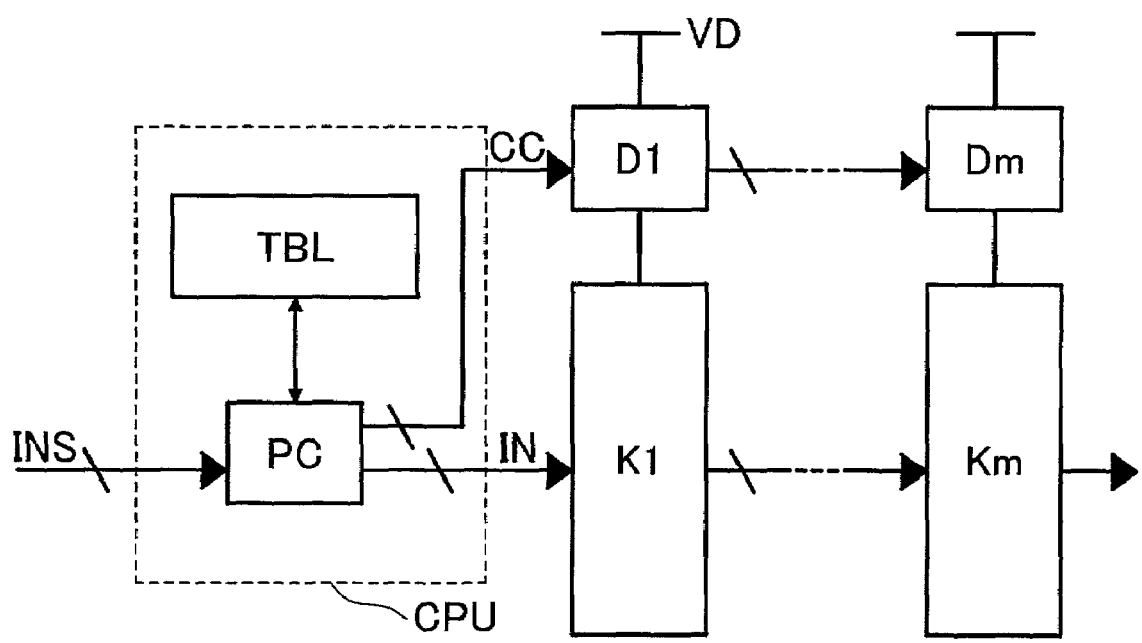
FIG. 7 is a block diagram showing the structure of circuits in a semiconductor device according to a seventh embodiment of the present invention.

Hereinbelow, a description is given of an example in which power is controlled by such a predicting operation that power data is compared with data in a history or a preset control method according to a seventh embodiment of the present invention with reference to FIG. 7. Referring to FIG. 7, when the instruction INS or the data inputted to the CPU is transmitted to a program controller PC, the program counter PC refers to a table TBL for storing therein the history or the preset control method, decodes the instruction INS or the data, and extracts a pattern for realizing the highest performance at the lowest power. Although omitted, the program counter PC controls functional circuit blocks K1 to Km and power status control circuits D1 to Dm thereof, in accordance with the extracted pattern. In this case, the control method in the program counter PC comprises the steps of extracting the functional circuit blocks K1 to Km from among a large number of other circuit blocks, and setting an activating order in accordance with time series. Herein, if it is possible to set a plurality of power statuses of the functional circuit block K1 to Km, those power statuses are set besides the activating order. Alternatively, the control method in the program counter PC comprises the steps of referring to the table TBL, extracting at least one of the functional circuit block K1 to Km, which is not operated in many cases, setting the power of at least extracted one thereof to be at the low level, and the like.

The table TBL can be updated by the history. All the table TBL data can be stored in a memory on a chip. Alternatively, one part of the table TBL data can be stored in a ROM on the chip and the other part can be loaded to a RAM from software. Or, a rewritable nonvolatile memory is mounted on the chip and, therein, all or a part of the table TBL data can be stored. The power statuses of the functional circuit blocks K1 to Km can be changed by referring to the table TBL or the operations shown in FIGS. 2 to 5 can be performed in the functional circuit blocks K1 to Km on the premise of the content which is set by referring to the table TBL. Further, as shown in FIG. 6, the control operation of the overall system can also be performed.

<Eighth Embodiment>

Figure 8:
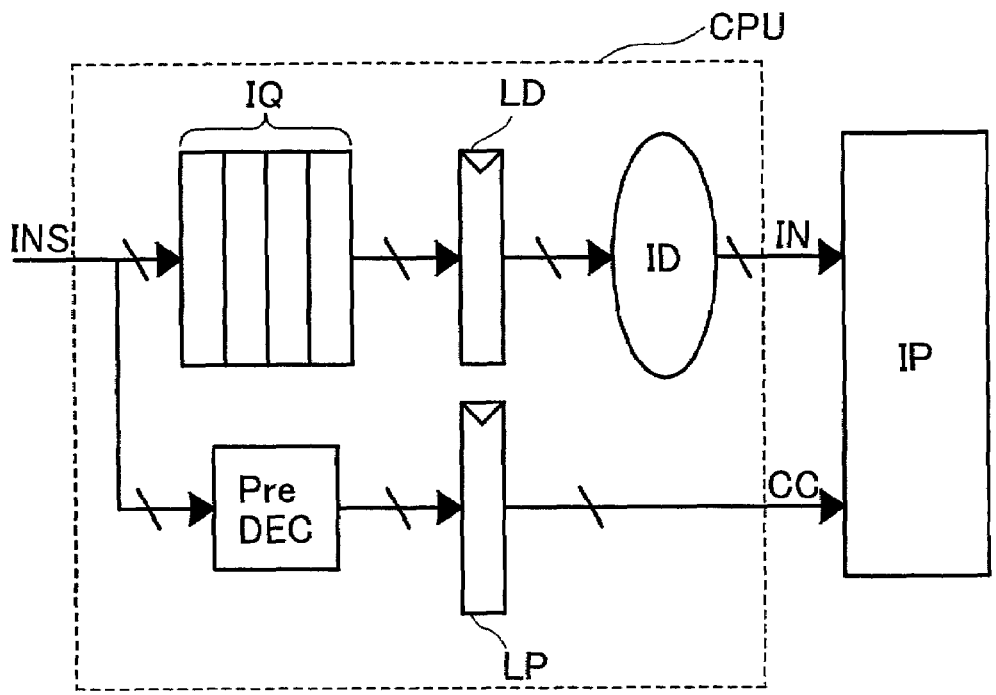
FIG. 8 is a block diagram showing the structure of circuits in a semiconductor device according to an eighth embodiment of the present invention.

Hereinbelow, a description is given of a case in which the data or the instruction INS inputted to the CPU includes power controlling information according to an eighth embodiment of the present invention with reference to FIG. 8. In this case, the instruction INS includes the power controlling information. Referring to FIG. 8, a CPU comprises a power control predecoder PreDEC which performs preceding processing of the power controlling information. The power control predecoder PreDEC transmits the resultant data of the preceding processing to a circuit block IP for processing thereof via a latch LP.

Normally, the instruction INS is first transmitted to an instruction buffer IQ, and is decoded via a latch LD by an instruction decoder ID so that the transmitted data is proper to data of the used circuit block IP. The decoded data is transmitted to the circuit blocks IP as an input signal IN. In this case, the resultant data of the predecoder PreDEC has been already transmitted to the circuit blocks IP and, then, the power control is executed. Thus, in the circuit block IP, a necessary power status is selected from a plurality of power statuses.

Accordingly, a plurality of circuit blocks IP can be controlled to reduce the power. For example, of a large number of circuit blocks IP, only the operating circuit block IP can be initialized in advance. This operation can be performed by combining the methods described in first to seventh embodiment, similarly to the description in FIG. 7. Incidentally, units of the instruction INS in FIGS. 7 and 8 can be a line, a block, a subroutine, and the like.

<Ninth Embodiment>

Figure 9:
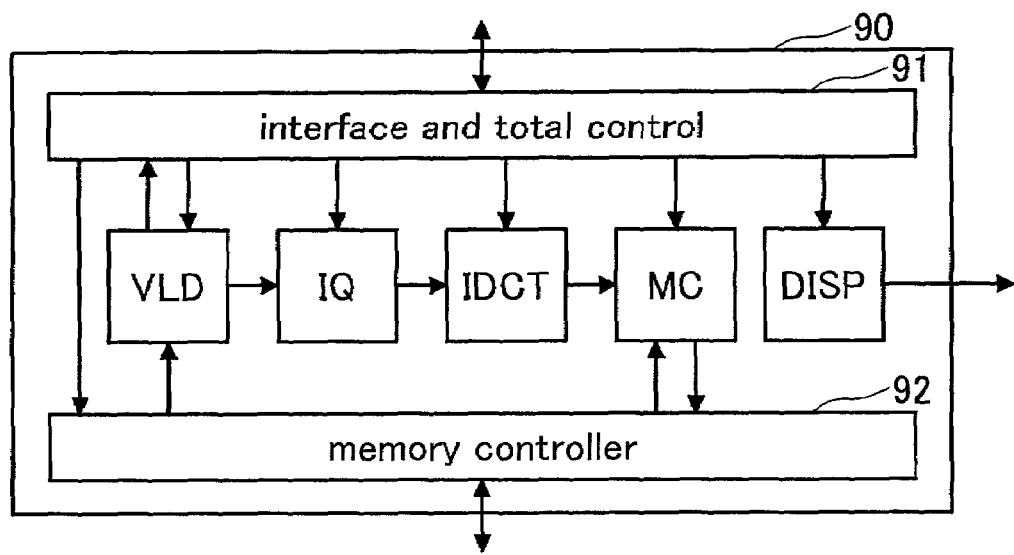
FIG. 9 is a diagram showing a moving picture processing circuit block according to a ninth embodiment of the present invention.

Hereinbelow, a description is given of a case in which the present invention is applied to a moving picture processing circuit block according to a ninth embodiment of the present invention with reference to FIG. 9. FIG. 9 is a diagram showing an example of a moving picture processing circuit block according to the ninth embodiment. A moving picture processing circuit block 90 comprises: an interface and total control unit 91 for controlling a host microcomputer (not shown) or controlling an operation for connection to a bus via which the moving picture processing block 90 is connected thereto or a circuit for controlling the total operation thereof; and a memory controller 92 for controlling memories used therefor, which are on-chip memories or a part of which or all of which are off-chip memories. If the moving picture processing circuit block 90 comprises an external SDRAM (Synchronous DRAM), the memory controller 92 controls the external SDRAM.

Referring to FIG. 9, the moving picture processing circuit block 90 further comprises: a variable decoding device VLD for decoding a code of a bit stream, which is inputted; an inverse quantization device IQ for transferring a quantized signal into an original signal; an inverse discrete cosine transformation device IDCT for processing inverse to discrete cosine transformation (DCT) which is frequently used in compressing; a motion compensation circuit MC; and a display DISP for display processing. Individual functions and processing content of the above circuit blocks are described in items of H261 and MPEGs 1 to 4 of the ITU-T recommendation or items of ISO13818 and IS11172 of the ISO recommendation and, therefore, the description thereof is omitted.

Figure 10:
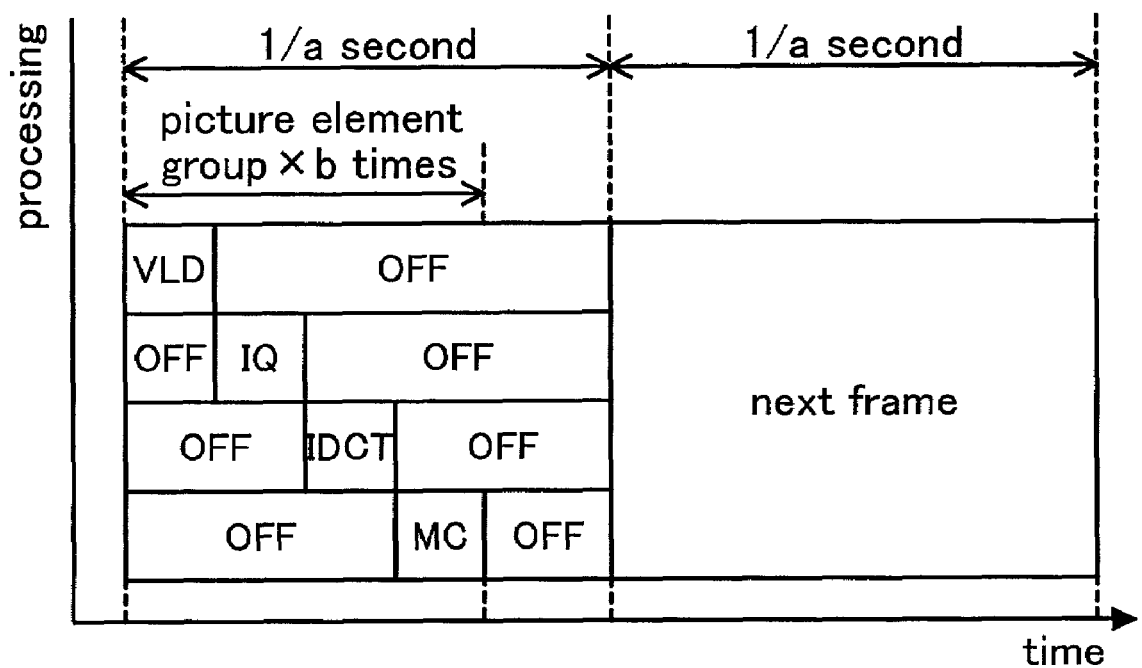
FIG. 10 is a diagram showing operations of the moving picture processing circuit block shown in FIG. 9.

FIG. 10 shows operations of the moving picture processing circuit block 90 shown in FIG. 9, excluding circuit blocks of the display processing. A moving picture corresponding to the number of a frames is processed per second. In general, each image frame is divided into a plurality of groups of picture elements (e.g., b groups), and signal processing is performed every group of the picture elements. Sequentially, each group of the picture elements is subjected to various processing of the variable decoding device VLD, the inverse quantization device IQ, the inverse discrete cosine transformation device IDCT, and the motion compensation circuit MC.

As shown in FIG. 10, when the variable decoding device VLD ends the variable decoding for one group of the picture elements, the variable decoding for another group of the picture elements is in an off-state until the other group of the picture elements is inputted. According to the ninth embodiment, therefore, by automatically detecting (predicting) an interval of the off-state of the variable decoding, the variable decoding device VLD shifts to the low-power status.

Although not shown, the above circuit blocks are actually operated in a manner of a pipeline, therefore, the one group of the picture elements is completely subjected to the variable decoding and it is inputted to the inverse quantization device IQ, and, then, the other group of the picture elements is inputted to the variable decoding device VLD. That is, these operations correspond to the so-called pipeline operation. In this case, according to the present invention, in the variable decoding device VLD, the inverse quantization device IQ, the inverse discrete cosine transformation device IDCT, and the motion compensation circuit MC, the necessary processing times thereof are different and, consequently, the circuit blocks thereof can automatically enter the low-power status, respectively, when finishing the individual processing.

In some cases, a time necessary for ending the processing of all the b groups of the picture elements is shorter than a processing time of 1/a sec, which is required for the processing of the moving elements of the frame. According to the present invention, by automatically detecting (predicting) the above states, by the variable decoding device VLD, the inverse quantization device IQ, the inverse discrete cosine transformation device IDCT, and the motion compensation circuit MC, the power status can shift to the low-power status. That is, the power switch is turned off, the applied voltage is reduced, or the input frequency is decreased.

As mentioned in FIG. 7, the power status can be controlled in accordance with the history or the preset control method upon the operation. Alternatively, as shown in FIG. 8, the power can be controlled by including the content for controlling the power in the instruction INS for the operation.

<Tenth Embodiment>

Hereinbelow, a description is given of a case in which the power status control circuit D1 and the functional block KB shown in FIG. 2 are controlled by automatically updating (learning) the shutdown cycle number of clocks CLK with reference to FIG. 11 according to a tenth embodiment of the present invention.

Figure 11:
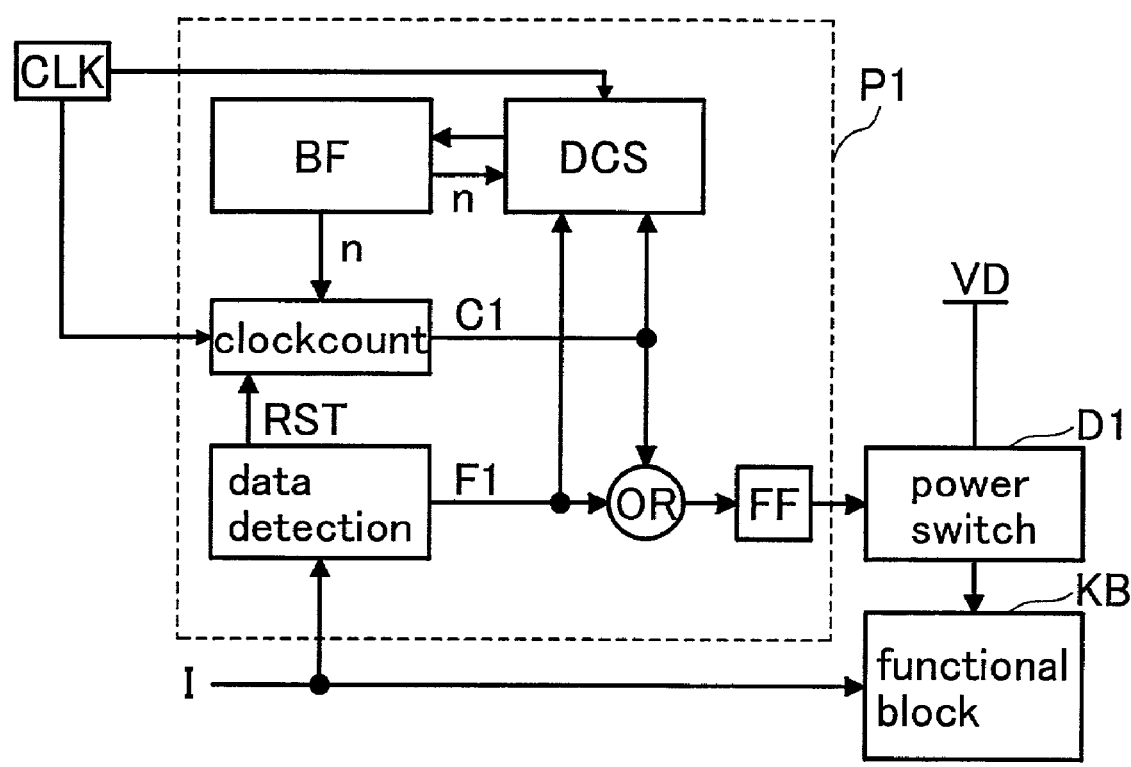
FIG. 11 is a block diagram showing the structure of circuits in a semiconductor device according to a tenth embodiment of the present invention.

Referring to FIG. 11, a determination circuit DCS arranged in the prediction circuit P1 refers to a shutdown cycle number buffer BF, and shuts down a power witch (corresponding to the power status control circuit in FIG. 2) D1 based on the number of clocks CLK inputted thereto and an input detection signal F1 as resultant data of the input detection DT for detecting the input data in the input I.

Operations of the determination circuit DCS will be described later with reference to FIG. 12. The shutdown cycle number buffer BF transmits an instruction of the cycle number n of clocks CLK for the instruction until the shutdown, to a clock counter CT. The clock counter CT counts the number of clocks CLK and, when the counted value matches the cycle number n of clocks CLK, it transmits a shutdown signal C1. An OR circuit receives the input detection signal F1 from the input detection DT and the shutdown signal C1 indicating the number of the clocks CLK which is counted by the clock counter CT, thereby performing OR operation. The resultant data of the OR operation is received to a flip-flop FF, and the resultant data of the flip-flop FF is inputted to the power switch D1, thereby controlling the functional block KB. Incidentally, the input detection DT operates synchronously with the clock CLK, and it outputs a reset signal RST to the clock counter CT for the counting the number of clocks CLK when the input data is detected.

Figure 12:
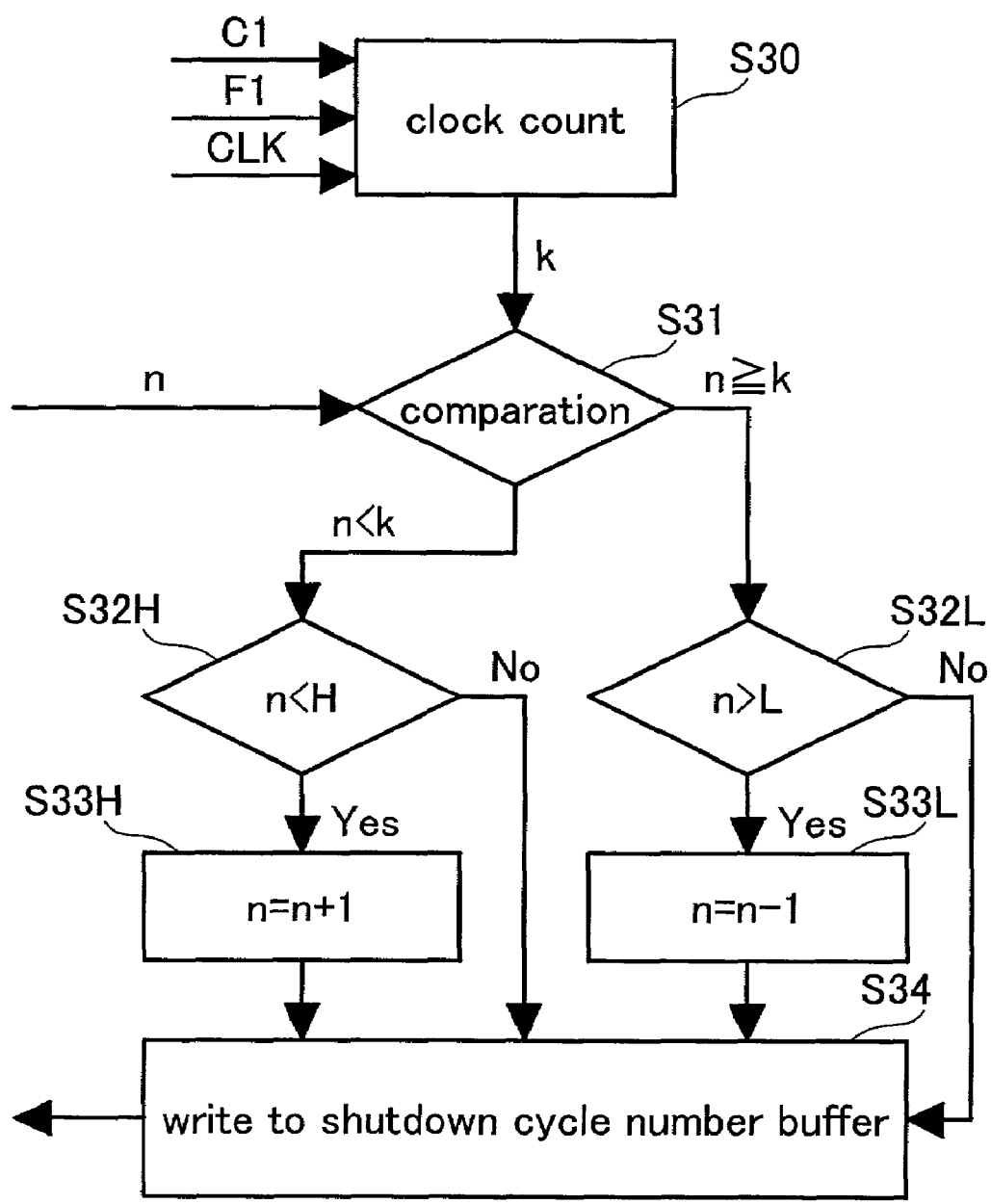
FIG. 12 is a flowchart showing a control method of a prediction circuit shown in FIG. 11.

FIG. 12 shows a control method of the determination circuit DCS in FIG. 11. First, the determination circuit DCS counts the cycle number k of clocks CLK from the shutdown to the next cycle based on the shutdown signal C1, the input detection signal F1, and the number of clocks CLK (step S30) Next, the cycle number k of clocks CLK is compared with the cycle number n of clocks CLK until this shutdown, which is stored in the clock counter CT (step S31).

If the cycle number n of the clocks CLK, which is stored, is equal to k or more, the cycle number n of the clocks CLK stored is compared with a lower limit value L of the shutdown cycle number of clocks CLK (step S32L). If the cycle number n of clocks CLK, which is stored, is greater than the lower limit value L, the cycle number n of the clocks CLK, which is stored, is decremented by 1 (step S33). The value of (n−1) is written to the shutdown cycle number buffer BF (step S34). If the cycle number n of clocks CLK, which is stored, is smaller than the lower limit value L, the cycle number n of clocks CLK, which is stored at present, is written to the shutdown cycle number buffer BF (step S34). In this case, the cycle number n of clocks CLK is not changed and, therefore, it may be not written to the shutdown cycle number buffer BF.

If the cycle number n of clocks CLK, which is stored, is smaller than k in step S31, the cycle number n of clocks CLK is compared with an upper limit value H (step S32H). If the cycle number n of clocks CLK, which is stored, is smaller than the upper limit value H of the shutdown number of clocks CLK, the cycle number n of clocks CLK is incremented by 1 (step S33H). A value of (n+1) is written to the shutdown cycle number buffer BF (step S34). If the cycle number n of clocks CLK, which is stored, is greater than the upper limit value H, the cycle number n of clocks CLK, which is stored at present, is written to the shutdown cycle number buffer BF (step S34). In this case, the cycle number n of clocks CLK is not changed and, therefore, it may not be written to the shutdown cycle number buffer BF.

Accordingly, the cycle number of clocks CLK until the shutdown after no data is inputted can be automatically updated.

Figure 21:
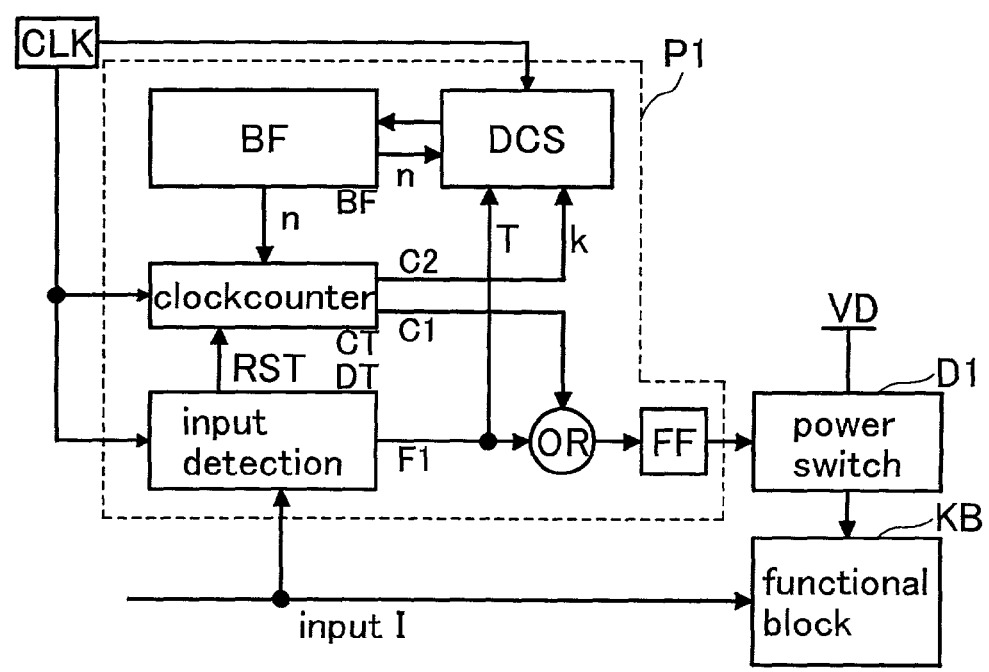
FIG. 21 is a block diagram showing a modification of the structure of the circuits shown in FIG. 11.
Figure 22:
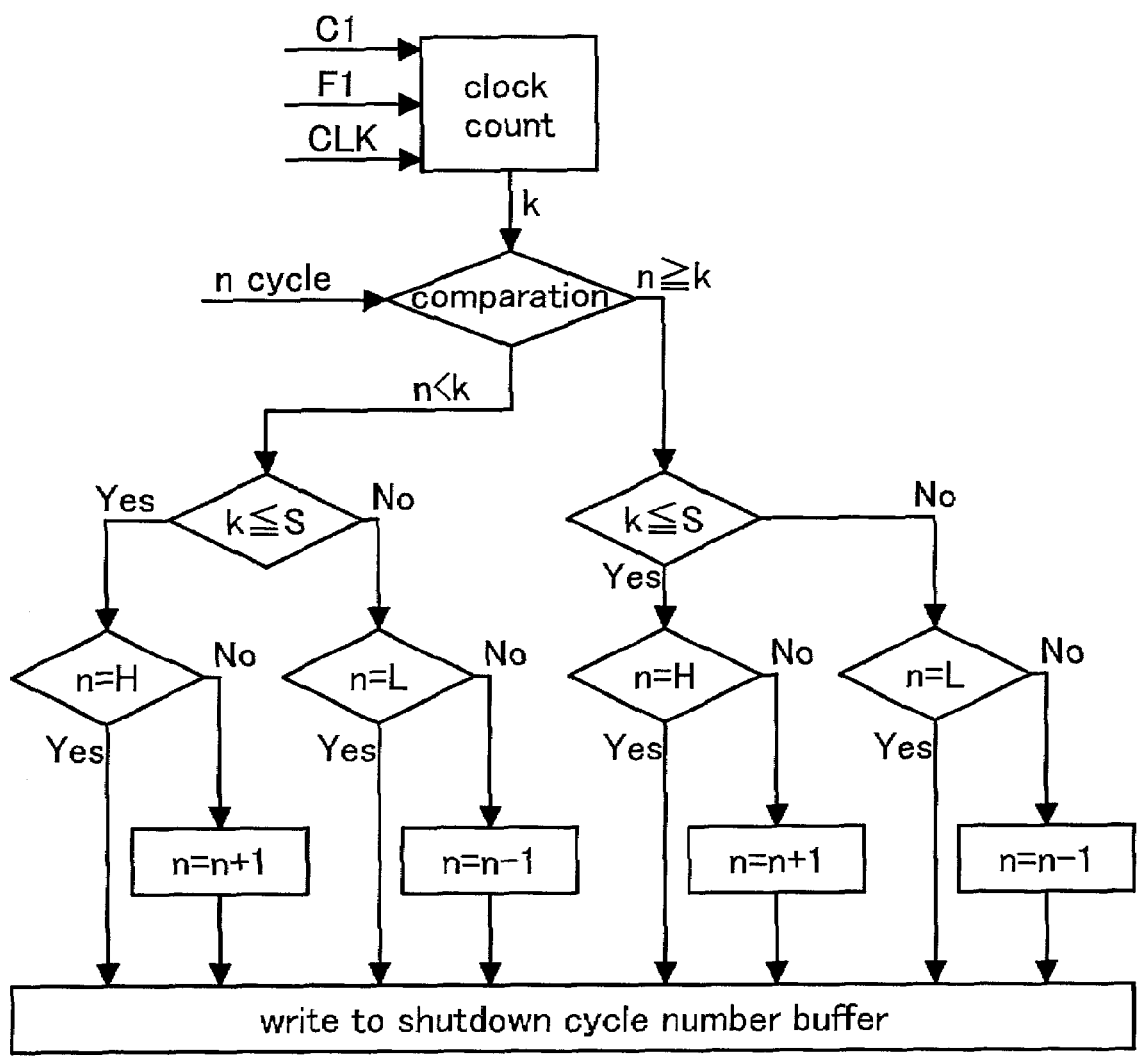
FIG. 22 is a flowchart showing operations according to a control method of a prediction circuit shown in FIG. 21.

Further, the cycle number of clocks CLK until reactivation after temporary shutdown can be predicted in the structure shown in FIG. 21. The operations of the determination circuit DCS are shown in FIG. 22.

In the structure in FIG. 21, differently from that in FIG. 11, the clock counter CT counts the cycle number k of clocks CLK from the shutdown to the next cycle and further outputs a shutdown signal C2. Incidentally, the number n of clocks CLK is the shutdown cycle number of clocks CLK. Referring to FIG. 22, reference symbol H denotes the upper limit value of the shutdown cycle number of clocks CLK, reference symbol L denotes the lower limit value of the shutdown cycle of clocks CLK, and reference symbol S denotes an effective inter-shutdown cycle number of clocks CLK. The effective inter-shutdown cycle number S of clocks CLK is determined depending on a balance between the effect for reducing power due to the shutdown and the increase in power due to the operation of the prediction circuit P1 as a control circuit. That is, the effective inter-shutdown cycle number S of clocks CLK is determined depending on actual power level of the prediction circuit P1 and the reduced power level during a shutdown interval corresponding to the effective inter-shutdown cycle S number of clocks CLK. If the interval corresponding to the effective inter-shutdown cycle number S of clocks CLK is excessively short, the power of the prediction circuit P1 is higher than the reduced power, thus canceling the effect for reducing the power.

<Eleventh Embodiment>

Figure 13:
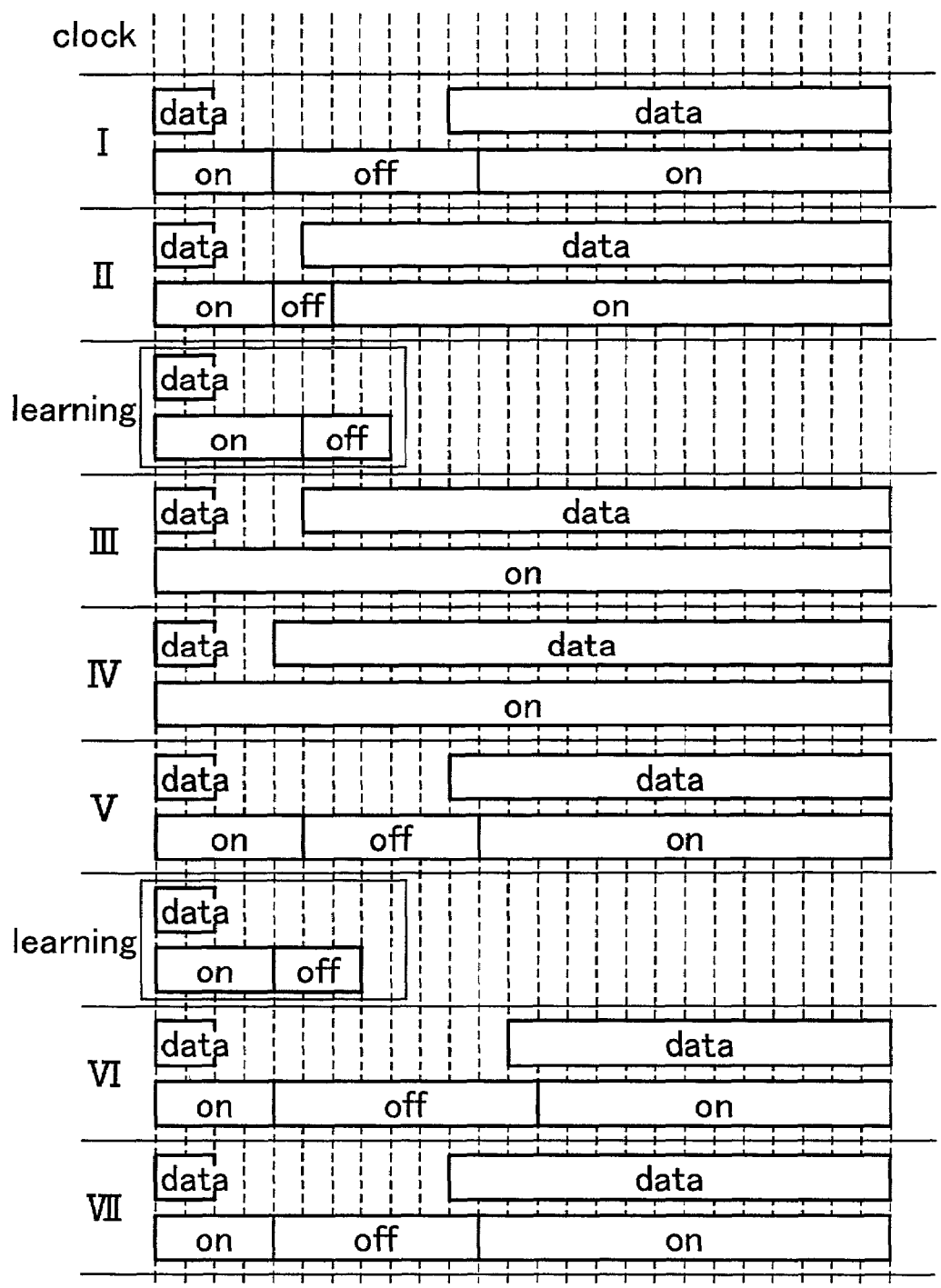
FIG. 13 is a flowchart showing operations including processing for a learning function according to an eleventh embodiment of the present invention.

Hereinbelow, a description is given of a case of operations in which power is actually controlled in such a manner that the power status control circuit D1 controls the power of the functional circuit block K1 as shown in FIG. 2 or 11 according to an eleventh embodiment of the present invention with reference to FIG. 13. Referring to FIG. 13, in the on-power status, the power status control circuit D1 supplies power to the functional circuit block K1 (that is, the power status control circuit D1 is connected), and, in the off-power status, the power status control circuit D1 supplies no power to the functional circuit block K1 (that is, the power status control circuit D1 is insulated).

A description is given of examples I to VII, as change portions for continuous time, in which power is changed depending on the presence or absence of the input data in accordance with the clock CLK shown at the top in FIG. 13. In the middle of the examples I to VII, self-update of the number of clocks CLK from the timing at which no data is inputted to the off-power status, that is, processing for learning is inserted.

It is assumed that the power status control circuit D1 is in the off-power state when two clocks CLK are counted after no data is inputted. Referring to FIG. 18, the power status control circuit D1 is in the off-power status when n is 2. It is assumed that when the data is inputted again after the off-power status, the cycle number of clocks CLK of standby for circuit activation is 1. Referring to FIG. 19, the power status control circuit D1 is in the off-power state when m is 1.

In the case of initialization, first, in the example I, the power status control circuit D1 is in the off-power status when the two clocks CLK are counted after no data is inputted. Then, no data is inputted at an interval corresponding to 6 clocks CLK and, thereafter, data is inputted again. Consequently, no data is inputted at an interval corresponding to 8 clocks CLK after the previous interval of no input data. The power is reduced at the interval corresponding to the 6 clocks CLK.

In the example II in which the change portion when time passes is indicated, the next data is inputted when 3 clocks CLK are counted after no data is inputted. Then, in this setting state, since the power status control circuit D1 is in the off-power status when two clocks CLK are not counted, the power status control circuit D1 is in the off-power status. After one clock CLK is counted, the next data is inputted. Therefore, promptly, the power status control circuit D1 enters the standby mode for the on-power status, and, then, the power status control circuit D1 shifts to the on-power status when the one clock CLK is counted after data is inputted. That is, the off-power status corresponds to two clocks CLK. The off-power status corresponding to the 2 clocks can be effective in one case and it cannot be effective in another case. Because the power status control circuit D1 must be operated to perform the above operations according to the first to tenth embodiments, thus needing consumption power. Therefore, if the interval for the off-power status is excessively short, the effect for reducing the power is nullified because of the power consumption due to the transition between the off-power status and the on-power status. Further, the recover from the off-power status to the on-power status needs them clocks CLK (in this case, m is 1). Corresponding to the transition, the processing time is long. Furthermore, if the interval for the off-power status is excessively short, not only the effect for reducing the power is nullified but also the processing speed is easily low. If the above-mentioned short interval for the off-power status continues, this setting is not preferable. In this case, by the learning function in the prediction circuit P1, it is determined that the two clocks CLK is too small and the number of clocks CLK is changed.

In other words, as described as the learning function in FIG. 13, it is determined that the power status control circuit D1 enters the off-power status if no data is inputted for an interval corresponding to three clocks CLK.

In the example III in which the change portion when time passes is indicated, the prediction of the prediction circuit P1 is correct and an interval between data corresponds to only three clocks CLK. Since data is inputted before the next cycle, the transition between the on-power status and the off-power status is not caused and the on-power status continues. Consequently, the nullification of the reduction of power and the decrease in processing speed due to the off-power status for the short interval can be prevented.

In the example IV in which the change portion when time passes is indicated, the prediction of the prediction circuit P1 is correct, and an interval between data corresponds to two clocks CLK. In this case, the power status control circuit D1 does not enter the off-power status and it continuously operates.

In the example V in which the change portion when time passes is indicated, differently from the examples I to IV, an interval between data corresponds to eight clocks CLK. In this case, after checking that no data is inputted for an interval corresponding to three clocks CLK, the power status control circuit D1 shifts to the off-power status. When data is inputted again and, then, one clock CLK is counted, the power status control circuit D1 returns to the on-power status. Therefore, an interval for the off-power status corresponds to six clocks CLK, and it is long. It is assumed that the prediction circuit P1 determines that the long interval for the off-power status corresponding to the six clocks CLK continues after that.

Therefore, in the next learning state, if two clocks CLK are counted after no data is inputted, no data is inputted, the power status control circuit D1 shifts to the off-power status.

In the example VI in which the change portion when time passes is indicated, the prediction of the prediction circuit P1 is correct, so that a data train corresponds to an interval for the off-power status is long. That is, the interval between data corresponds to ten clocks CLK. In this case, if no data is inputted after two clocks CLK is counted, the power status control circuit D1 shifts to the off-power status. Consequently, the interval for the off-power status corresponds to nine clocks CLK.

In the example VII in which the change portion when time passes is indicated, similarly to the example V in which the change portion when time passes is indicated, an interval between data corresponds to eight clocks CLK. The interval for the off-power status corresponds to the six clocks CLK in the example V in which change portion when time passes is indicated and, on the contrary, a long interval for the off-power status corresponds to the seven clocks CLK in the example VII. That is, by the learning function, the power can be reduced.

Although only one clock CLK is increased or decreased in FIG. 13, the number of clocks CLK may be other values. Further, in the case of determining the transition to the learning state, it is determined how many times the number of clocks CLK, different from that at the previous time, continues, depending on the system LSI.

Figure 14A:
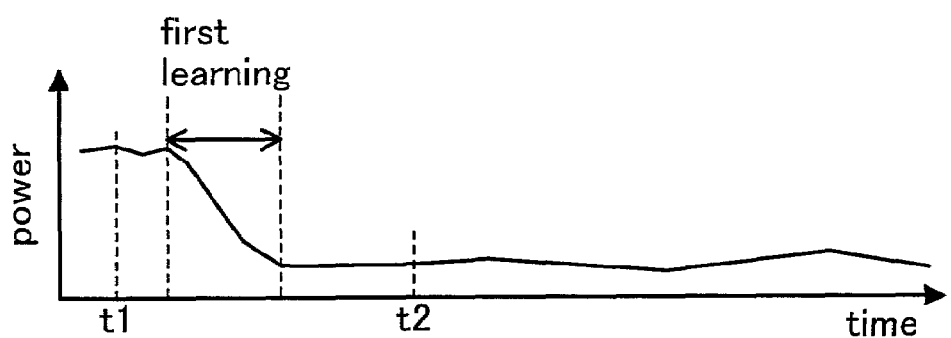
FIGS. 14A to 14C are diagrams for explaining the frequency of the processing for the learning function.
Figure 14B:
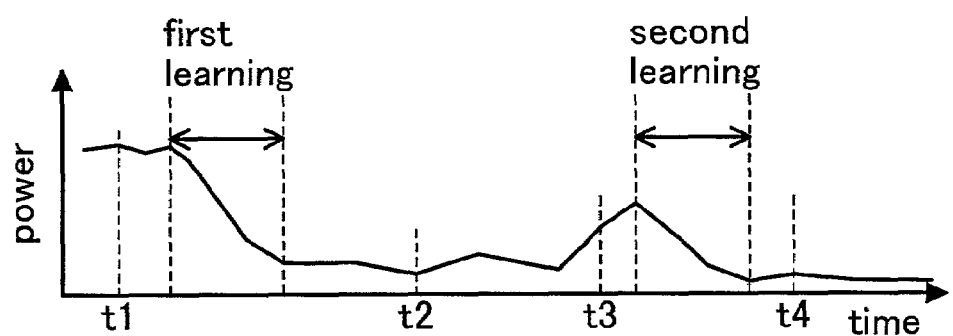
Figure 14C:
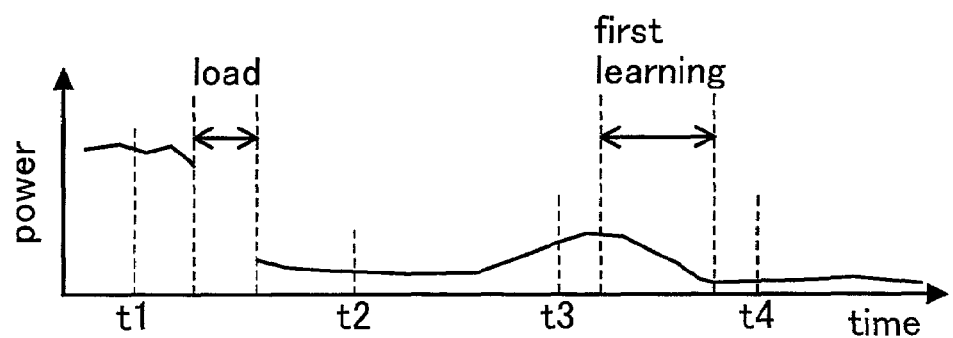

FIGS. 14A to 14C show the frequency of the learning, in which the axis of abscissa denotes time and the axis of ordinate denotes power of the system LSI. Referring to FIG. 14A, there is only a first learning and, thereafter, the content of the first learning is kept. In other words, although high power is consumed at time t1, the power shifts to be in the best status after the time t1 due to the first learning (corresponding to the number of clocks CLK for the off-power status in FIG. 13). At time t2, the power is low.

Referring to FIG. 14B, besides the first learning, a second learning exists. At time t3, the power is increased again and, however, it is decreased at time t4 due to the second learning. That is, the power status can be dynamically changed.

Referring to 14C, power data as result of the past learning or a predetermined initial value is loaded. More specifically, an external storage table or an internal storage table is referred to, low-power data in the table is loaded, and the power is low at the time 2. The power control can continue based on the content of the loaded content. Alternatively, for example, as shown in FIG. 14C, the first learning can be performed, thereby accomplishing the optimization. Further, although a specific circuit block can entirely perform the above operations, data of w the low power pf the overall system LSI is loaded and, thereafter, a part of circuit blocks can further perform the learning, thus changing the power status. A learning phase of the overall system LSI is different from a learning phase of the specific circuit block. For instance, the learning phase of the overall system LSI corresponds to only an on-switch timing, and the learning phase of the specific circuit block corresponds to timing sequent to the on-switch timing.

Figure 15A:
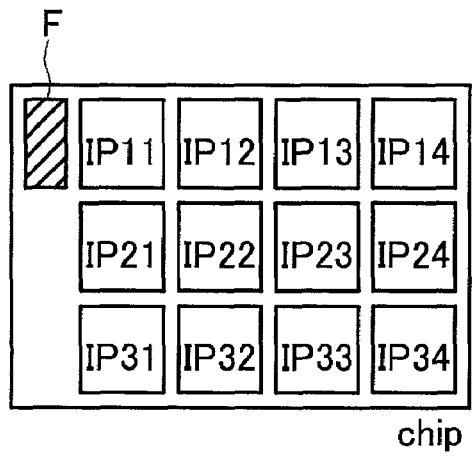
FIGS. 15A and 15B are diagrams showing the arrangement of a rewritable nonvolatile memory in the present invention.
Figure 15B:
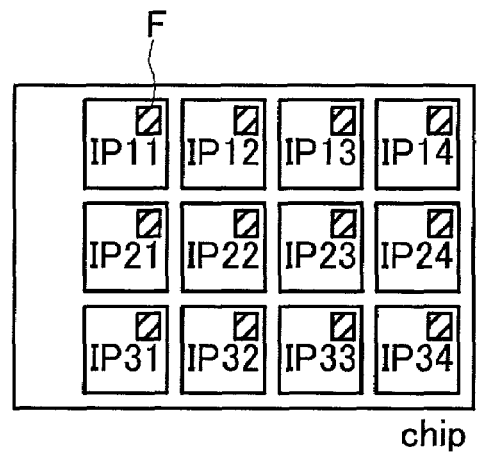

FIGS. 15A and 15B show a method for storing the power data as the result of the learning, the predetermined initial value to be loaded, or power data as a result of repeating the past leaning. The data is stored in an area of a rewritable nonvolatile memory on the chip.

Referring to FIG. 15A, for circuit blocks IP11 to IP34, an area F of a single rewritable nonvolatile memory is arranged. In other words, the area F of the rewritable nonvolatile memory is concentratedly arranged at one position on the chip. This case is efficient that data of the low power of the system LSI is stored in a table. In the circuit blocks IP11 to IP34, the data is stored in an SRAM or a register, and final power-status data or power data in the case of advantageous power control in a predetermined can be written to the area F.

Referring to FIG. 15B, the area F of the rewritable nonvolatile memory is arranged to each of the circuit blocks IP11 to IP34, that is, the area F of the rewritable nonvolatile memory is decentralized to each of the circuit blocks IP11 to IP34. Of course, all of the circuit blocks IP11 to IP34 do not need to have the area F. According to the present invention, each of the circuit blocks IP11 to IP34 has the rewritable nonvolatile memory which stores therein the past learning result and the like. A part of the past learning result may be stored in software necessary for the system LSI.

<Twelfth Embodiment>

According to a twelfth embodiment of the present invention, the following application can be realized. That is, processors which are greatly developed in recent years, are arranged in parallel and operated, thus improving processing performance.

Figure 16:
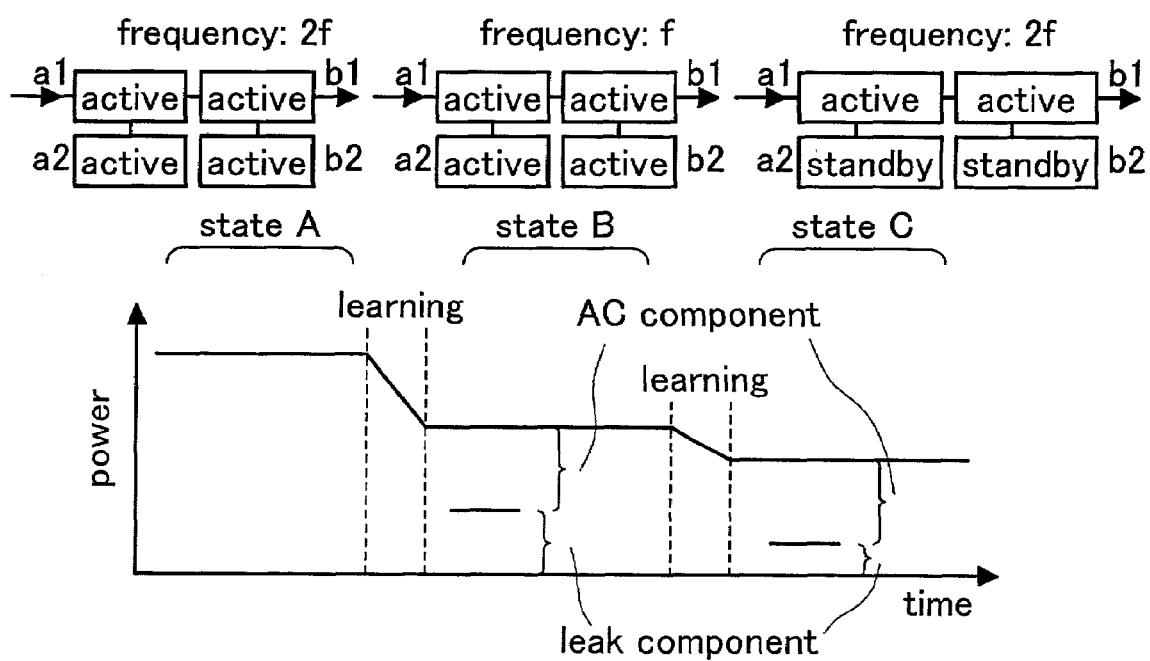
FIG. 16 is a diagram for explaining the reduction of power in processors which are arranged and operated in parallel in a semiconductor device according to a twelfth embodiment of the present invention.

Referring to FIG. 16, in a state A, at a frequency of 2f, circuit blocks a1, a2, b1, and b2 are active. The circuit blocks a1, a2, b1, and b2 correspond to processors which perform the same function, in which the processing performance in parallel processing is improved. In the above structure, the capacity of input data changes. In a state B in which the necessary processing capacity is smaller than that in the state A, the operating frequency 2f is changed to have a half value, i.e., an operating frequency f, according to the present embodiment. In the state B, the power comprises an AC component, that is, a component for charge/discharge of the load capacitance C in the case of a digital circuit, and the leak component as mentioned in the first to fifth conventional arts. In a high-frequency area, the leak component is unremarkable as compared with the AC component. However, in the system-LSI structure in that the circuit blocks a1, a2, b1, and b2 are active under the same power control condition, in a low-frequency area, the leak component is remarkable.

In this case, according to the present invention, the power of the circuit blocks a1, a2, b1, and b2 can be independently changed. That is, a state C corresponds thereto. In the state C, the circuit blocks a1 and b1 are active at the operating frequency 2f, and the leak current is cut off from the power of the circuit blocks a2 and b2 (that is, the circuit blocks a2 and b2 are in the standby mode). Thus, the processing performance is constant and the number of active circuit blocks is reduced to be half. As shown in FIG. 16, the leak component can be reduced and, consequently, the power is low as a whole.

By combining the first to twelfth embodiments, the power is autonomously decentralized and controlled so as to become proper. Accordingly, the better performance can be realized by lower power.

<Thirteenth Embodiment>

Figure 17:
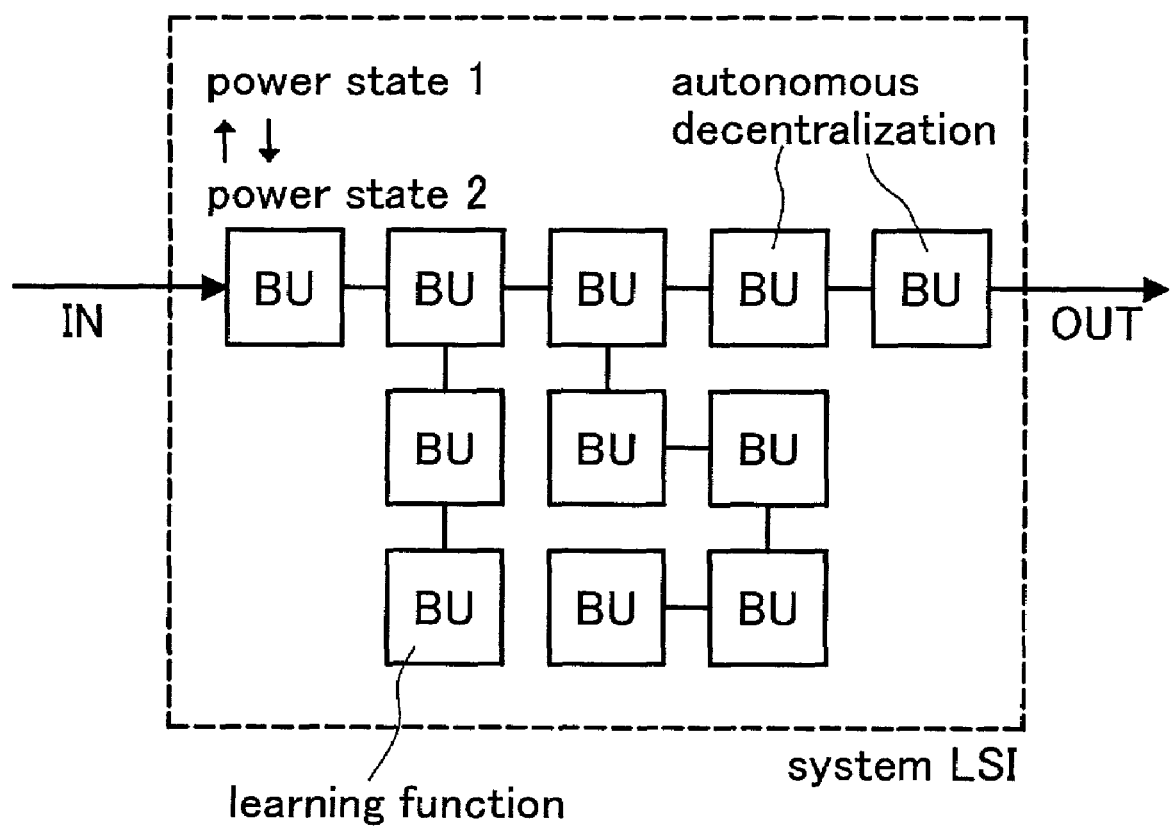
FIG. 17 is an explanatory diagram showing the overall system LSI serving as a semiconductor device according to a thirteen embodiment of the present invention.

Hereinbelow, a description is given of the structure in which a system LSI for obtaining an output signal OUT from an input signal IN comprises a plurality of basis units BU according to a thirteenth embodiment of the present invention with reference to FIG. 17. FIG. 17 shows an explanatory diagram showing the overall system LSI using a semiconductor device according to the thirteenth embodiment. In the current system LSI, the basis unit BU corresponds to an IP, a circuit block, or a circuit module. In general, the system LSI is formed by integrating the basis units BU, as the IPs, the circuit blocks, or the circuit modules, on a single substrate made up of Si (hereinafter, referred to as a single Si substrate). In the conventional system LSI, parts on a board on which the single system LSI is mounted are mounted on the single Si substrate.

In the case of designing the system LSI, a designer selects and collects a large amount of IPs having various design histories and forms the single system LSI. As a consequence, considering anode using a 1 µm-level technology, integrated on the single substrate of 8 mm$^2$, are substantially all units such as a system controller, a memory, a moving picture compression/decompression processing unit, a voice processing unit, an encryption processing unit, a processing unit of a camera input, a unit for protocol of wireless communication, a unit for protocol of wireline communication, and a unit for control of periphery devices. The above units comprise a numerous number of IPs.

Consequently, although the designer can roughly control the power, he can hardly optimize the design for an extremely short time when designing the product. Only a specific portion needs to be replaced with an other designed portion halfway. After the design, a specification of a circuit block is not correct and a portion corresponding thereto needs to be replaced.

However, according to the present invention, the functional circuit block with predictive power controller, as the basis unit BU (circuit block), is provided, thereby controlling the power so that the power is autonomously decentralized and is realized the reduction of the power. Therefore, the designer must not add the detailed design operation. Apart of the system LSI can be easily replaced. All of the circuit blocks or a part thereof can be controlled so as to reduce the power. Further, the reduction of the power can be realized by changing the two power-statuses, that is, the high-power status and the low-power status in accordance with the learning, the state, or an instruction from other component. Accordingly, according to the present invention, it is possible to realize a semiconductor device such as a system LSI capable of being designed, and being expanded, with reduced power and high performance.

As will be obviously understood, according to the first to thirteenth embodiments of the present invention, in each of the circuit blocks constructing the system LSI, the power can be autonomously decentralized to reduce the power. The transition of the power status can be changed by the learning. Accordingly, it is possible to realize the semiconductor device such as the system LSI manufactured in the practicable number of design steps, which is extensible and in which power is reduced.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A semiconductor device comprising:
a functional circuit block for performing a processing when an instruction or data is inputted,
a power status control circuit for controlling a power status of said functional circuit block, and
a prediction circuit coupled to receive the instruction or data for controlling said power status control circuit, independently of other computation devices, based on said instruction or data and on an interval between successive instructions or data which are inputted to both the functional circuit block and the prediction circuit,
wherein said power status control circuit comprises a power shutdown circuit for shutting down power which is supplied to said functional circuit block, said power shutdown circuit being coupled to said functional circuit block and a power supply,
wherein clock pulses are inputted into said functional circuit block and said power status control circuit,
wherein said prediction circuit comprises a counter for counting the number of clock pulses inputted to said functional circuit block and to said counter, a control circuit for controlling said power shutdown circuit, and an input detection circuit receiving the instruction or data inputted to said functional circuit block for detecting said instruction or data inputted to said functional circuit block,
wherein said counter outputs a first signal to said control circuit when a number of said clock pulses counted is n,
wherein, when there is no instruction or data inputted to said functional circuit block, said input detection circuit outputs a reset signal to said counter to reset a counting of said clock pulses and outputs a second signal to said control circuit, and said control circuit outputs an output signal of a first state to shut down said power supplied to said functional circuit block when both said first and second signals are inputted to said control circuit,
wherein said functional circuit block comprises a register for temporarily storing said instruction or data and a functional block for computation, and
wherein said prediction circuit further comprises a comparator for controlling said register by comparing the output of said control circuit with the number of clock pulses inputted to said comparator and a predetermined number, said comparator starting a counting of said clock pulses when said control circuit outputs said output signal of a second state.

2. A semiconductor device comprising:
a functional circuit block for performing a processing when an instruction or data is inputted,
a power status control circuit for controlling a power status of said functional circuit block, and
a prediction circuit coupled to receive the instruction or data for controlling said power status control circuit, independently of other computation devices, based on said instruction or data which is inputted to both the functional circuit block and the prediction circuit,
wherein said power status control circuit comprises a power shutdown circuit for shutting down power which is supplied to said functional circuit block, said power shutdown circuit being coupled to said functional circuit block and a power supply,
wherein clock pulses are inputted into said functional circuit block and said power status control circuit,
wherein said prediction circuit comprises a counter for counting the number of clock pulses inputted to said functional circuit block and to said counter, a control circuit for controlling said power shutdown circuit, and an input detection circuit receiving the instruction or data inputted to said functional circuit block for detecting said instruction or data inputted to said functional circuit block,
wherein said counter outputs a first signal to said control circuit when a number of said clock pulses counted is n,
wherein, when there is no instruction or data inputted to said functional circuit block, said input detection circuit outputs a reset signal to said counter to reset a counting of said clock pulses and outputs a second signal to said control circuit, and said control circuit outputs an output signal of a first state to shut down said power supplied to said functional circuit block when both said first and second signals are inputted to said control circuit,
wherein said functional circuit block comprises a register for temporarily storing said instruction or data and a functional block for computation, and
wherein said prediction circuit further comprises a comparator for controlling said register by comparing the output of said control circuit with the number of clock pulses inputted to said comparator and a predetermined number, said comparator starting a counting of said clock pulses when said control circuit outputs said output signal of a second state.

* * * * *